United States Patent
Celia, Jr. et al.

(10) Patent No.: US 9,911,710 B2
(45) Date of Patent: Mar. 6, 2018

(54) THERMO-COMPRESSION BONDING SYSTEM, SUBSYSTEMS, AND METHODS OF USE

(71) Applicant: MRSI Systems, LLC, N Billerica, MA (US)

(72) Inventors: Nicholas Samuel Celia, Jr., Avon, MA (US); Cyriac Devasia, Nashua, NH (US)

(73) Assignee: MRSI Systems, LLC, N. Billerica, MA (US)

( * ) Notice: Subject to any disclaimer, the term of this patent is extended or adjusted under 35 U.S.C. 154(b) by 14 days.

(21) Appl. No.: 14/890,768

(22) PCT Filed: May 13, 2014

(86) PCT No.: PCT/US2014/037800
§ 371 (c)(1),
(2) Date: Nov. 12, 2015

(87) PCT Pub. No.: WO2014/186337
PCT Pub. Date: Nov. 20, 2014

(65) Prior Publication Data
US 2016/0126213 A1    May 5, 2016

Related U.S. Application Data

(60) Provisional application No. 61/822,912, filed on May 13, 2013, provisional application No. 61/926,637, filed on Jan. 13, 2014, provisional application No. 61/928,183, filed on Jan. 16, 2014.

(51) Int. Cl.
*B23K 37/04* (2006.01)
*H01L 23/00* (2006.01)

(52) U.S. Cl.
CPC .......... *H01L 24/75* (2013.01); *B23K 37/0408* (2013.01); *H01L 24/81* (2013.01);
(Continued)

(58) Field of Classification Search
None
See application file for complete search history.

(56) References Cited

U.S. PATENT DOCUMENTS 5,368,217 A * 11/1994 Simmons ............... B23K 20/02
228/44.7
6,012,711 A     1/2000 Cipolla
(Continued)

FOREIGN PATENT DOCUMENTS

JP      63111633 A  *  5/1988
JP      04087344 A  *  3/1992
(Continued)

OTHER PUBLICATIONS

International Search Report for PCT Application No. PCT/US2014/037800 dated Sep. 17, 2014, 18 pages.

*Primary Examiner* — Devang R Patel
(74) *Attorney, Agent, or Firm* — Maine Cernota & Rardin

(57) ABSTRACT

Co-planarity adjustment systems and methods, gantries capable of applying high force without imposing moment loads to their bearings, systems and methods for achieving rapid heating and cooling and efficient slidable seal systems capable of sealing a chamber and injecting one or more fluids into the chamber as well as actively recovering portions of such fluid which have migrated into the seal itself are disclosed in the context of thermo-compression bonding systems, apparatuses and methods, although many alternative uses will be apparent to those of skill in the art.

4 Claims, 16 Drawing Sheets

(52) U.S. Cl.
CPC .... *H01L 24/13* (2013.01); *H01L 2224/13101* (2013.01); *H01L 2224/755* (2013.01); *H01L 2224/75101* (2013.01); *H01L 2224/75251* (2013.01); *H01L 2224/75252* (2013.01); *H01L 2224/75265* (2013.01); *H01L 2224/75266* (2013.01); *H01L 2224/75267* (2013.01); *H01L 2224/75281* (2013.01); *H01L 2224/75282* (2013.01); *H01L 2224/75301* (2013.01); *H01L 2224/75901* (2013.01); *H01L 2224/81097* (2013.01); *H01L 2224/81098* (2013.01); *H01L 2224/81203* (2013.01); *H01L 2224/81815* (2013.01); *H01L 2924/181* (2013.01); *H01L 2924/2011* (2013.01); *H01L 2924/20105* (2013.01); *H01L 2924/20111* (2013.01); *H01L 2924/351* (2013.01)

(56) References Cited

U.S. PATENT DOCUMENTS

| 6,146,912 A * | 11/2000 | Tighe ................ H01L 21/67144 |
| | | 438/15 |
| 8,834,146 B2 * | 9/2014 | Saha ........................ C03C 19/00 |
| | | 425/150 |
| 2010/0252615 A1 | 10/2010 | Suga et al. |

FOREIGN PATENT DOCUMENTS

| JP | 05-029403 A | 2/1993 |
| JP | 2002-217241 A | 8/2002 |
| JP | 2004-096046 A | 3/2004 |
| JP | 2007-058483 A | 10/2007 |
| JP | 2012-245646 A | 12/2012 |

* cited by examiner

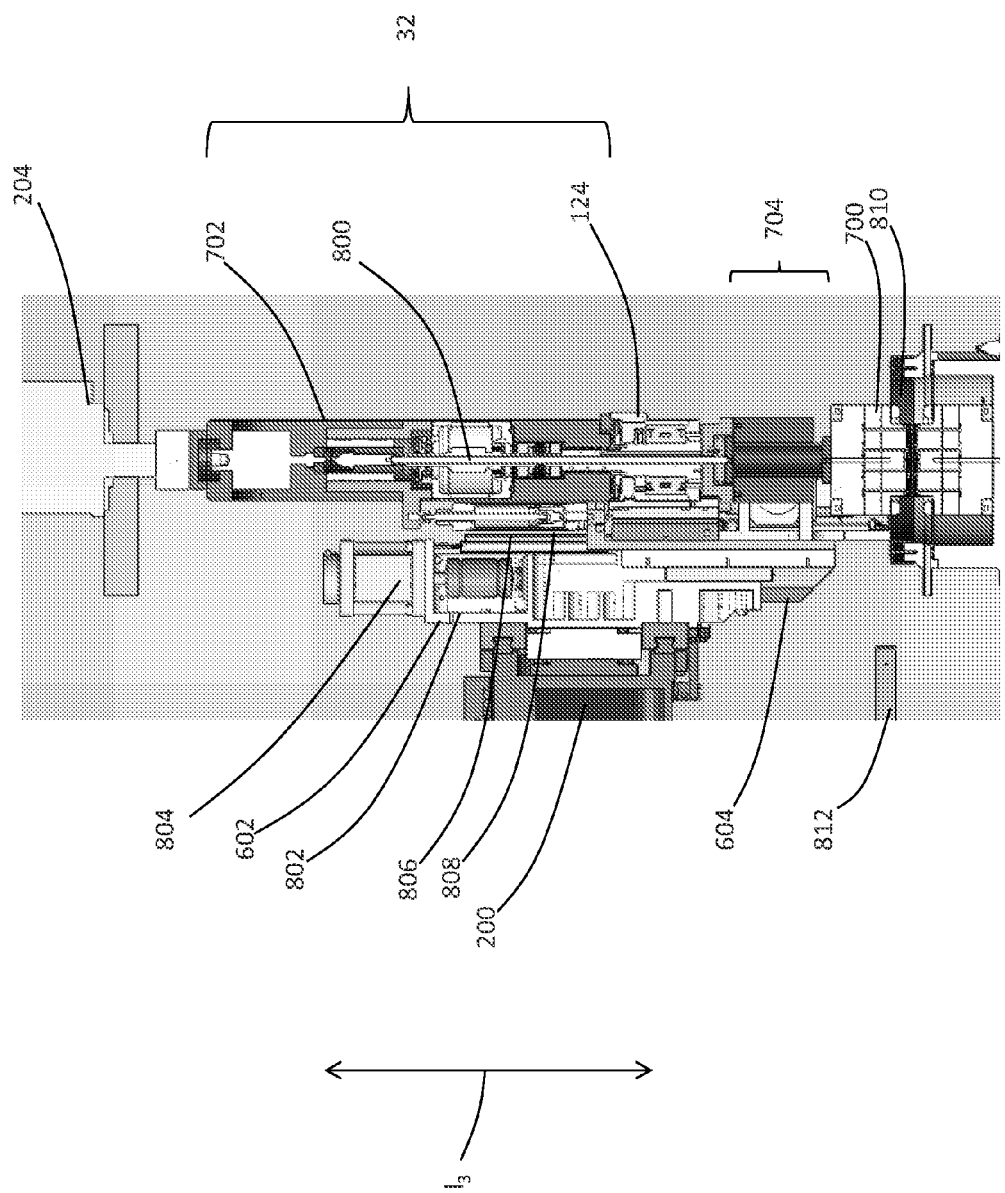

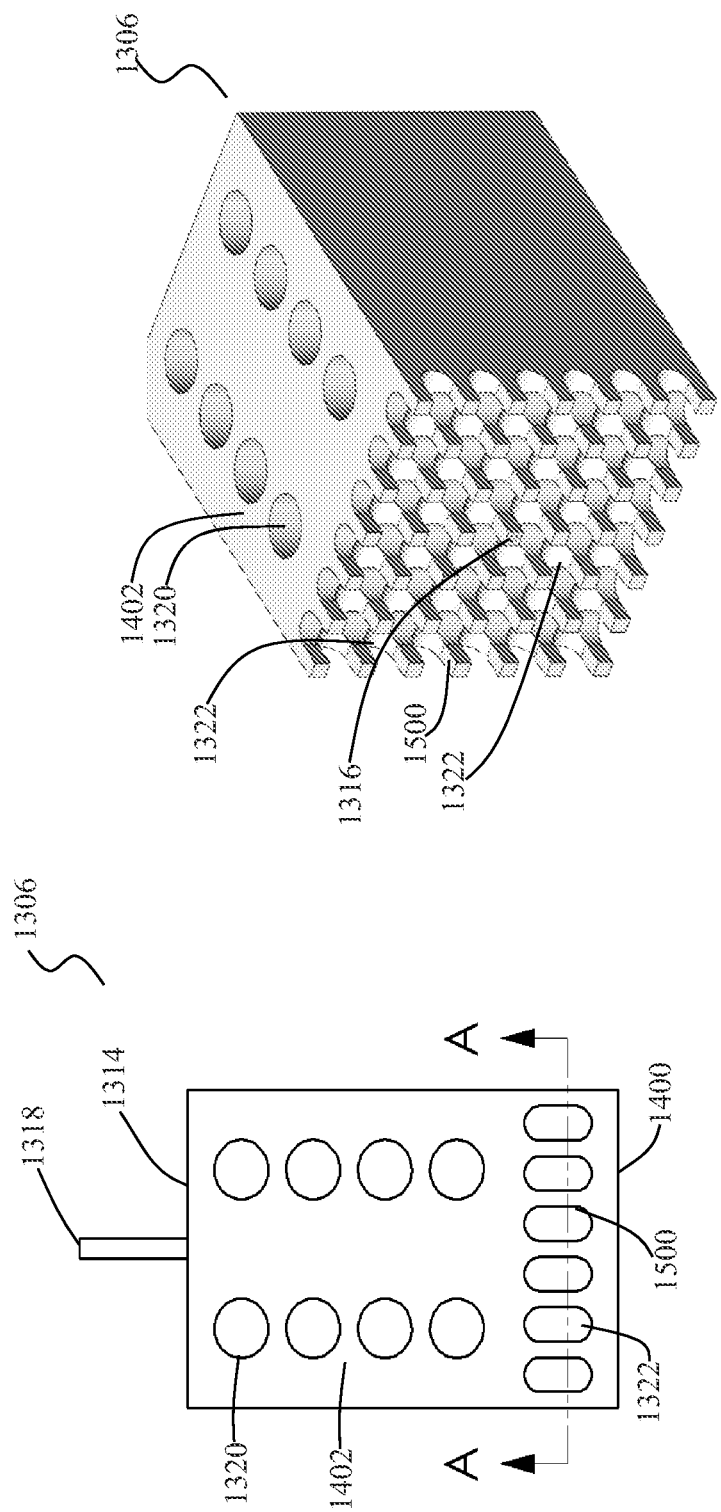

THERMO-COMPRESSION BONDING SYSTEM, SUBSYSTEMS, AND METHODS OF USE

RELATED APPLICATIONS

This application is a national phase application filed under 35 USC § 371 of PCT Application No. PCT/US2014/037800 with an International filing date of May 13, 2014, which claims priority to U.S. Provisional Application No. 61/822912, filed May 13, 2013; U.S. Provisional Application No. 61/926637 filed Jan. 13, 2014; and U.S. Provisional Application No. 61/928183, filed Jan. 16, 2014. Each of these applications is herein incorporated by reference in their entirety for all purposes.

FIELD OF THE INVENTION

The invention relates to precision bonding of dies to substrates, and more particularly, to a system and methods of use for a "flip-chip" thermo-compression bonding system and subsystems.

BACKGROUND OF THE INVENTION

Existing thermo-compression bonding systems are quickly becoming inadequate as higher demands are placed on such systems by new and rapidly improving technology. Improvements to current thermo-compression bonding systems are required in order to facilitate thermo-compression bonding of the latest and largest dies and substrates. Some key components of such systems, including a description of their capabilities and limitations, are outlined below.

Co-Planarity Adjustment System

In high accuracy thermo-compression bonding applications it is critical to ensure co-planarity of the surfaces of the die and substrate to be bonded. Co-planarity, as used in this disclosure should be read as two opposing surfaces which are parallel to one another, i.e. they occupy the same plane. Attaining co-planarity of the surfaces upon which these components rest is the first step in achieving a uniform bonding of die to substrate; when the die and substrate are perfectly parallel, all solder bumps on the die will make contact with their corresponding substrate bond pads simultaneously, assuming all solder bumps were perfectly formed. Lack of co-planarity results in poor bonding with an uneven gap between die and substrate around the die perimeter once the bonding is completed. This can lead to the bonding process being compromised in the extreme case. In other cases the downstream process step of under-filling the gap between die and substrate is compromised, resulting in yield losses.

Prior art co-planarity adjustment mechanisms tend to be unduly complicated and do not typically ensure that the corresponding surfaces are parallel across their entire surfaces. One example of such a prior art system is an auto-collimator. An auto-collimator is expensive and complex, requiring a high quality objective lens, capable of producing a collimated beam (parallel light rays) and motors with fine degrees of control, while only providing a point measurement, or the measurement of multiple points. Auto-collimators work by collimating light, using a high quality objective lens and directing the collimated light onto a plane mirror. The separation between the original (i.e. incident) light and the reflected light is then compared. By comparing the separation of the reflected light and adjusting the angle of the working surfaces, the working surfaces can be brought into a parallel relationship. In the foregoing description, a plane mirror should be understood as a mirror having a planar reflective surface. For light rays striking a plane mirror, the angle of reflection equals the angle of incidence, enabling the foregoing measurements. Importantly, a collimated beam of light does not spread out after reflection from a plane mirror, except for diffraction effects. Measurements of co-planarity made using this method are only based on a single point or a small number of single point measurements taken at various locations, however, making this method not particularly well suited to ensuring parallelism of opposing planes across their entire surfaces requiring extreme accuracy.

Therefore, it is desirable to have an automatic method of ensuring the surfaces that hold the die and substrate are parallel to one another, using the average across the entire surface as the reference.

Gantry Without Moment Loading

Gantries are commonly used in many automated processes to move parts from one place to another with precision. In most gantry designs used for thermo-compression bonding, the placement head is offset in an X or Y axis from the gantry rail/bearing supports, assuming bonding force is applied along a Z-axis and all planes are orthogonal to one another. Using such a gantry to apply force to a part however requires that the force applied not cause an excessive amount of deflection in the gantry itself, which is typically limited by the load carrying ability of the bearings upon which it rides.

For lower force applications, the moment loads exerted (by the placement head during die placement) on the gantry bearings are negligible. At higher forces however, the moment loads can be significant. For applications requiring both high forces and high accuracy, these moment loads can result in small excursions at the bearing support, which are then amplified at the placement head, since they are offset in X or Y axis from the bearing. This results in placement inaccuracies. High force bonding, in this context, typically involves applying a bonding force of approximately 30-50 Kg.

Prior art devices would typically use a conveyor belt, moving table, or other system to bring parts to a high force bonding system, which was stationary and which would typically make use of a large welded structure as a support. This structure added complexity and cost to the system and reduced the room available for other subsystems within the thermo-compression bonding system as well as the flexibility of the gantry itself, making a gantry capable of high force application without moment loading commercially desirable. Such a system would ideally allow for 6 degrees of freedom in the thermo-compression bonding system, but would enable the locking out of five of those degrees of freedom during high force bonding.

Heating & Cooling System

Thermo-compression bonding requires heating of a die and substrate in order to initiate bonding. Typically, in flip-chip thermo-compression bonding, the die will have already had small solder bumps applied to the surface to be bonded to the substrate, which has typically has small metal pads applied to the side to be bonded to the die that correspond to the solder bumps on the die. The die and substrate must be heated while pressure is applied in order to bond the die to the substrate. Even a single failed bond can cause a malfunction of the product. Die head heaters are used to heat the die, while substrate heaters are used to heat the substrate.

Die head heaters used in thermo-compression bonding require high temperature ramp and cooling capability as well as temperature uniformity to ensure reliable thermo-compression bonding. These heaters are typically run at 400-420° C., but may be run to 500° C. in some situations. Substrate heaters are typically kept at lower temperature (~150° C.) and may not require the high temperature ramp/cooling capability of the bond head heater.

During thermo-compression bonding, heat is typically applied primarily to the die (typically silicon) since it can handle higher temperatures than the substrate, which is typically made out of organic material. This heat is transferred from the die to the substrate via the aforementioned solder bumps. The substrate acts as a heat sink, pulling heat away from the die. The attach process naturally creates a hot spot at the center of the die whereby the center solder bumps fuse to the substrate pads below, but the bumps at the outer periphery of the die may not. Typically, the larger the die, the larger the temperature gradient between the center and the edge of the die will be. This is true even with a heater which is uniformly heated across the die surface. This may lead to poor attach at the die edges, which is especially problematic in the case of relatively large dies.

To achieve adequate bonding at the edges of the die using such a system, the die head temperatures may be set higher than would otherwise be required. This exposes portions of the die to higher temperatures than required, which could lead to failure of the die or reliability issues later. The extra heat required by this uneven bonding must also be generated and dissipated during production of each die/substrate combination, resulting in longer cycle times than might otherwise be achievable.

Another concern regarding thermo-compression bonding heaters is their ability to heat and to dissipate heat quickly. Lowering the ramp-up and ramp-down times are crucial for lowering the overall cycle time and enabling higher production rates. Prior art systems use relatively small heaters with forced air cooling. This can work well for smaller dies, but results in unacceptably long cycle times for larger dies.

Current workarounds involve the use of trim heaters, which attempt to balance the extra heat loss from the edges by adding a fixed amount of heat back into the edges of the heater. This can also minimize thermal stresses by minimizing uneven expansion. Even with the current state of the art, the centers of such heaters still tend to be relatively hot as compared to other portions of the heater.

Still another concern regarding heating of a die and substrate in thermo-compression bonding applications is that, during bonding, the exact temperature at the intermetallic interface between the die bumps and the substrate pads is not known and not easy to determine in a dynamic system. In prior art systems, a delay is introduced after the bond head reaches a pre-determined temperature, to ensure the desired die bumps to substrate pad interface temperatures are reached where the bumps melt, alloy and attach to the substrate pad. These delays are empirically determined for a given die/substrate combination, resulting in shorter or longer cycle times and potential under or over heating of the die and substrate. This could be avoided if there was a direct method of determining that bonding had occurred or the pre-determined temperature had been reached.

Furthermore, the substrate heater arrangement is typically larger than that of the die heater, to cater to a wide range of substrate sizes, and has significant thermal mass. When the die and substrate are brought together and the die is subsequently heated, the substrate with the heater arrangement below acts as a heat sink, pulling heat away. Since the mass of the substrate heater is significantly higher, its temperature does not appreciably change during the bond cycle. It also means that the bond head, typically above the substrate head, must have enough heating power to overcome the 'drag' of the heat sink effect of the substrate heater.

Thus for higher performance, throughput and bonding of larger dies a solution is needed to minimize temperature gradients during the attachment phase of thermo-compression bonding and to allow for more accurate judgment of temperature at the interface between die bumps and substrate pads.

Bond Chamber Sealing:

During the thermo-compression bonding process, it is often necessary to evacuate the bonding chamber of oxygen and other oxidizing agents because of the elevated temperatures used, which may result in unacceptable degradation of the product if not addressed. Typically, nitrogen is used as the inert gas, but other fluids, gases or combinations of either or both are also known. Occasionally, fluids, gases or combinations of either or both which are capable of removing oxidation, especially at lower temperatures, are used as well.

In the first case, it is desirable to form a sealed bonding chamber to make efficient use of the inert gas. In the second case, it is typically imperative to seal the chamber to prevent the fluid or gas from reacting with other components of the machine, possibly causing degradation, as well as to protect the health and safety of the operators of such machines. Typically, an oxygen sensor would be used to ensure that the chamber was sufficiently evacuated for the intended operation to proceed.

Current machines have not yet devised a solution which provides efficient sealing while retaining some flexibility to conform to a surface that is not precisely co-planar. Current solutions also fail to offer a seal which may retain its sealing ability while engaging in limited sliding motion in the plane defined by a sealing surface on the substrate head.

What is needed, therefore, are techniques for sealing a bonding chamber which allow for the efficient usage of inert and oxide removal fluids, gases or combinations of either or both, which can provide effective sealing between surfaces which may not be co-planar while allowing sliding motion in the plane defined by a sealing surface of the substrate head.

BRIEF SUMMARY OF THE INVENTION

Embodiments of the present invention provide a co-planarity adjustment system for bringing two opposing planar surfaces into a parallel relationship. Such a system is particularly useful for thermo-compression bonding, where surfaces on which a die and substrate are held must be kept as parallel as possible to improve cycle times and ensure a full bond is achieved across the full width of the components, although such a system could be incorporated into a variety of machine providing for contact between two planar articles or mating work pieces.

Some embodiments use the concept of master and slave surfaces having respective master and slave planes, where the slave plane is made to conform to the master plane to achieve co-planarity of the respective surfaces. In thermo-compression bonding, the master plane would typically be the plane of the die head working surface and the slave plane would be the plane of the substrate head or platen, although it would be feasible to reverse these roles.

In embodiments, the slave surface may be lockably mounted on a spherical bearing assembly, whereby the pitch orientation of the slave plane with respect to the reference plane is variable within the limits of the spherical bearing assembly. The variation in pitch can be measured plane to plane or orthogonally axis to axis Such limits may allow as much as +/−five (5) degrees or more with respect to the master or reference plane, but should preferably provide at least +/−two (2) degrees range of pitch motion when unlocked. Such a mechanism would typically be weighted or otherwise biased for self-centering alignment of the slave plane to the assumed orientation of the master plane, or put another way, alignment of their respective axis. The center of the slave surface may be located proximate the center point of rotation of the spherical bearing assembly to ensure motion of the slave surface when the spherical bearing assembly is unlocked and in motion is substantially constrained to changes in pitch orientation with respect to an axis orthogonal to the master plane. A drive mechanism, operating along an axis substantially orthogonal to the master plane, may be configured to bring the master surface and the slave surface into surface contact, which would force the slave plane to conform to the master plane and thereby achieve co-planarity of the two planes.

To facilitate unlocking of the spherical bearing, typically performed in an automated manner by a controller, with manual operation also a possibility, a spherical bearing release mechanism may be configured to unlock the spherical bearing lock mechanism when actuated, thereby allowing motion of the spherical bearing assembly and movement of the slave plane.

This release mechanism may also include a fluid system configured upon actuation to apply a first fluid under pressure to the distal end of the locking member so as to overcome the tension and move the locking member so as to disengage the locking contact between the bearing and the bearing seat, and to inject a bearing fluid under pressure between the bearing seat and the bearing whereby the spherical bearing assembly is made functional, and, upon deactivation to reduce pressure of the first fluid and the bearing fluid and thereby allow the lock mechanism to relock the spherical bearing assembly. In some embodiments, the first fluid and bearing fluid may be the same while in others they may differ. Exemplary fluids include nitrogen and air, although those skilled in the art will recognize that many fluids may be used for these purposes.

The spherical bearing locking mechanism, alluded to above, may be configured to normally hold the spherical bearing assembly in a locked position, whereby the pitch orientation of the slave plane is locked. This is desirable to prevent loss of co-planarity when the system is turned off or high forces are applied. An exemplary spherical bearing lock mechanism may use an axially oriented locking member, having a retaining head and a shaft. The shaft may slidably extend through oversize apertures in the spherical bearing and bearing seat. A distal end of the shaft may normally be held in tension with respect to the bearing assembly to bring the bearing into locking contact with the bearing seat whereby the spherical bearing assembly is immobilized.

Embodiments of the present invention, described above, could be calibrated to ensure co-planarity of the master and slave planes by unlocking the normally locked spherical bearing assembly, bringing the two planar surfaces together into full surface contact, thereby aligning the pitch orientation of the slave plane with the master plane, locking the spherical bearing assembly, thereby locking the slave plane in a co-planar relationship with the master reference plane, and separating the two planar surfaces. Those embodiments previously described using a fluid system for locking and unlocking of the spherical bearing would also require the user to reduce the first fluid and bearing fluid pressures in order to allow the lock mechanism to relock the spherical bearing assembly, although this could be programmatically controlled, as could any of the foregoing procedures involving achieving co-planarity using the described systems.

One embodiment of the present invention provides a gantry and force applicator for applying pressure to a work piece. Although such a device is particularly well suited for use in a thermo-compression bonding system, those skilled in the art will recognize that it may also be advantageously used in other systems. Such a gantry and force applicator of the present embodiment is held within a housing with designated x, y and z axis, further including a force receiving surface attached to the housing, located on and oriented orthogonally to the aforementioned z axis. This embodiment also includes a force applicator mechanism attached to the housing, axially aligned with the z axis, located at a substantial distance from a force receiving surface and oriented to apply force in the direction of the force receiving surface.

The gantry of this embodiment would typically be a multi-motion gantry system mounted to the housing, and having a die bond head system attached to the moving end, with a die head mounted on the die bond head system and oriented to oppose the force receiving surface. This gantry system would typically be configured to provide controllable motion with respect to at least one of x and y axis, thereby enabling the die bond head system to be extended and retracted laterally to and from a position between the force applicator mechanism and the force receiving surface. In embodiments, the die head may also be moved along the z axis towards and away from the force receiving surface, as required to accommodate a work piece positioned there between.

Such a die bond head system may further include an axially aligned force translator in communication with the die head, configured to translate externally applied force in the z axis to the die head without introducing additional force vectors to the gantry system. When the die bond head system is positioned by the gantry system on the z axis centerline proximate the force receiving surface, an axial extension of the force applicator mechanism could then deliver compressive force through the force translator to the die head surface against the force receiving surface or any work piece disposed there between.

Alternative embodiments of such a system may position the aforementioned force applicator on the die bond head system, and orient it such that, when extended axially, it contacts the force receiving surface. The same principles relating to translation of this force through a force translator into a die head would also be applicable to this embodiment. An exemplary force translator would be a substantially rigid rod, although those skilled in the art will recognize that there are many other possibilities.

Another embodiment of the present invention provides an overload protection circuit between the force receiving surface and the die head, whereby force in excess of a predetermined amount causes the force translator to fail so as to protect the die head and any work in progress. In some embodiments, this overload protection circuit may be an air cylinder, although those skilled in the art will recognize that a variety of overload protection circuits may serve these purposes.

A further embodiment of the present invention further comprises external force load sensors, encoders and micromotion control capability, allowing the motion of the die head to be controlled as a function of force and distance traversed. Some algorithms may also allow for programmatic prediction of forces through predictive analysis using the output of such measurement instruments.

Yet another embodiment of the present invention would also include, on the aforementioned die head, a die head heater, temperature sensor, and temperature control circuitry.

A yet further embodiment of the present invention provides such a system, further including a user interface for control, either automatic, manual or semi-automatic, and monitoring of gantry motion, die head position, externally applied force, and die head temperature. Such a control system may further provide indications of whether the process is running normally or has encountered an abnormal condition.

One embodiment of the present invention provides a heating system particularly well suited for thermo-compression bonding, although those skilled in the art will recognize it has many additional potential uses. Such a hearing system includes a die heater, a substrate heater and a temperature controller, which may be manual or automatic.

The aforementioned die heater is operatively connected to a power source and further connected to a bond head system. It is configured to supply heat to a die to be bonded. The aforementioned substrate heater is also in communication with a power source, which may be the same or a different source than that supplying the die head heater, and operatively coupled to a substrate bond station. It is configured to supply heat to a substrate to be bonded.

Also included in such a system is a temperature control means, which is operatively connected to the aforementioned power source, or sources, for limiting the amount of heating energy supplied to the die and substrate heaters to an amount sufficient to raise their temperature to a predetermined bonding temperature; wherein the die and substrate heaters include a plurality of separately controllable heating regions.

The aforementioned die and substrate heaters may be electrical resistance heaters, induction heaters, gas heaters, or any other heater capable of providing separately addressable heating regions and sufficient heat to complete the bonding operation at hand. Exemplary heaters using traces of material to provide such differential heating (i.e. separately addressable heating regions) may use tungsten or other materials for their traces and aluminum nitride for their bodies and external portions, since both materials have compatible coefficients of thermal expansion over a wide range of processing temperatures, although those skilled in the art will recognize that a variety of materials could be used.

In another embodiment of the present invention, the substrate heater may be heated to approximately 150 degrees Celsius while the die heater may be heated to between 400-500 degrees Celsius during a thermo-compression bonding operation of a die to a substrate.

A further embodiment of the thermo-compression bonding heating system includes a substrate heater having two heater traces, a first heater trace positioned adjacent to a perimeter of the substrate heater and a second heater trace substantially evenly covering a central region of the substrate heater, wherein each heater trace may be independently controlled. Yet further embodiments include heaters having rings of separately and concentrically addressable heating regions or separately addressable heating regions arranged in a grid.

The foregoing thermo-compression bonding system could be used, in an exemplary process, to selectively apply an excess of heat to a peripheral region of the substrate heater, thereby causing the peripheral region to attain a higher temperature than a central portion of the substrate heater. After differentially heating the substrate heater, heat could then be applied to a central region of said die heater, although the heat could also be applied evenly over the surface of the die heater without exceeding the scope of this disclosure, whereby the difference in heat between the selectively heated regions of the die and substrate heaters are sufficient to cause the heat fluxes of the die and substrate heaters to be in opposition to one another during bonding. This competing heat flux phenomenon is desirable to create more even heating, thereby allowing lower processing temperatures than those of the prior art and a higher process yield, due to decreased waste from incomplete bonding and/or part failure due to prolonged high heat exposure necessitated by the prior art heating devices.

An alternative heating apparatus could also be used in a variety of processes, although it too is particularly well suited for thermo-compression bonding. Such a heating apparatus includes a heater body having a first surface operatively connected to a thermo-compression, or other, bonding system, a second surface distal from the first surface, for transferring heat to a product to be bonded and at least one cavity sized to accept a heater insert. This cavity, or each cavity in the case of multi-cavity heaters, may contain at least one heater insert, which would be in communication with a power source. The heating apparatus of this embodiment also includes a manifold, which contains a portion of the heater body, this portion typically being adjacent to the second surface of the heater body, and would further include at least one fluid injector. The fluid injector, in this embodiment, includes a proximal end in communication with a fluid supply and a distal end capable of fluid injection operatively coupled to an internal volume of the manifold. A manual or automatic controller could further be operatively connected to the injector or injectors, allowing control of the rate of injection of a fluid into said manifold. Lastly, such a heater would typically include at least one exhaust passage and a control means operatively connected to the power source for adjusting the amount of heating energy supplied to the heaters to an amount sufficient to raise their temperature to a predetermined temperature.

Such a heating apparatus may also include a passage extending between and through the first and second surfaces, to allow a vacuum to be pulled, for engaging and retaining a part to be bonded or other purposes.

Such a heating apparatus may further include a plurality of channels adjacent the second surface and within the portion of said heater body contained by the manifold, thereby increasing the surface area and improving the ramping capabilities of the heating apparatus. These channels may be formed of a substantially interlocking array of channels.

The aforementioned exhaust passage may also be in communication with a vacuum source, a containment chamber and/or a heat exchanger and fluid recycling system.

The aforementioned heating apparatus could be put to use by heating the heater body to a pre-set temperature, injecting fluid into the manifold, and slowing or stopping the injection of fluid to allow the temperature of the second surface of the heater body to rapidly increase. After bonding, the rate of fluid injection could then be increased to rapidly cool the second surface of the heater body. Importantly, the heater body temperature should not be substantially decreased by the injection of fluid, only the temperature of the second surface, upon which a die would typically be placed for bonding, should be rapidly and controllably altered by the injection of the fluid. An exemplary temperature to keep the heater body at during use would be 600 degrees Celsius for a thermo-compression bonding application. Alternatively, the injectors could inject a variety of fluids, gases, liquid metals, or other materials in order to achieve supplementary heating in addition to cooling.

One embodiment of the present invention provides a substrate heater designed to closely match the substrate's overall size with a low thermal mass. The heater has feedback traces close to its top layer, where the substrate is placed. During bonding the substrate heater holds the substrate at a fixed (lower) preset temperature. During bonding, as the die is ramped to a higher temperature, the lower mass substrate heater reacts relatively quickly as the heat flows thru the bumps to the substrate and then to the heater below the substrate. The feedback traces located below the substrate pick up the change in temperature as soon as the heat flows thru the die bumps into the substrate. Instead of a fixed dwell set empirically (prior art) which can and does change due to die/substrate variations, and cleanliness, looking for a change in temperature of the substrate heater allows a user to determine more precisely when the die bumps to substrate pad interface temperatures have been reached resulting in a more robust process. Alternatively, an encoder configured to measure movement of the die bond head system with respect to the z-axis could monitor for a sudden, small, change in the position of the die bond head system, which could also be used to indicate temperature, since such small scale motion would occur upon collapse of the die bumps.

One embodiment of the present invention provides a slidable seal system, well suited for sealing of a bonding chamber. Such a slidable seal system of this embodiment includes a compliant sealing body (e.g. a bellow) having an upper portion encircling and sealingly engaged to a die head. A first end of the die head would typically remain external to the compliant sealing body, allowing for it to be connected to the remainder of the system. A second, opposite, end of the die head, in this embodiment, would be enveloped by the compliant sealing body. The system further includes a bearing body having a first portion external to the compliant sealing body and a second portion internal to the compliant sealing body. The bearing body is sealingly connected to the compliant sealing body, at an end opposite that connected to the die head. The bearing body of this embodiment further includes a channel on a surface opposing a surface to be sealed against.

The, surface, which is typically flat, opposing the bearing body is referred to as the seal collar, which may surround a chamber, a bond chamber in some embodiments, positioned opposite and substantially parallel to the bearing body channel. The bearing body also includes at least one seal body, in communication with at least one fluid source, substantially contained within the bearing body channel; the seal body being slightly narrower than the bearing body channel. This relationship between the bearing body and seal forms fluid passageways in the gaps between the bearing body channel and the seal body, providing for controlled fluid communication between the area to be sealed and the at least one fluid source, with a surface of the sealing body proximal the seal collar forming a second sealing surface. Such a seal body also has the benefits of allowing very efficient use of fluids and the ability to reposition the die bond head system for completion of multiple operations or other reasons.

The seal body may also include one or more vacuum relief passages, in communication with one or more vacuum sources, on the first sealing surface, opposing the second sealing surface. This allows a strong vacuum seal between the first and second sealing surfaces, with the vacuum acting as a vacuum hold down and scavenging any fluids which may escape from the bond chamber during processing. In this way, the first and second sealing surfaces define a sealed cavity therebetween when the seal is active. Lastly, at least one extendable and retractable actuator, in communication with at least one controller, having a first end fixed to a first end of the die head and a second end fixed to the first portion of the bearing body, enable the slidable seal to be retracted from or lowered onto the first sealing surface during operation. These actuators could be linear actuators, piezo actuators or any number of other actuators suitable for extending and retracting when connected between the components previously described.

In embodiments, the compliant seal of the slidable seal system, described above, is made of polytetrafluoroethylene, in other embodiments it may be made of other materials possessing the required compliance, mechanical strength, temperature stability and chemical resistance, dependent on the nature of the process to be sealed. Furthermore, the fluid used in conjunction with the slidable seal system may be an inert fluid (e.g. nitrogen), an oxide removal fluid (e.g. formic acid), or other fluid appropriate for the process being conducted.

In another embodiment of the present invention, the seal body of the slidable seal system is an air bearing. This air bearing may be made of porous carbon or other suitable materials. Edges of the air bearing, where it is undesirable to allow the fluid injected therethrough to escape, may additionally be sealed by covering these surfaces with a material or sleeve impregnable to the fluid being injected therethrough.

The previously described slidable seal system and embodiments thereof may be used by first positioning a part or parts to be acted upon within the sealed cavity created by the seal. The next step would then require positioning the bearing body proximately to the seal collar and activating the actuators to extend, thereby bringing the bearing body proximate to the seal collar. After the bearing body and collar are adjacent to one another, the vacuum source could then be activated to apply vacuum, via the vacuum relief passage, thereby strengthening the sealing force between the first and second sealing surfaces. Lastly, this process may include displacing one or more fluids from the at least one fluid source through the fluid passageways in communication with the sealed area. To unseal the chamber, one would typically terminate the vacuum from the vacuum source, cease displacement of the at least one fluid through the fluid passageways in communication with the sealed cavity.

In some embodiments requiring oxide removal, formic acid, or other oxide removal fluid, may be injected, followed by nitrogen, to form a barrier to escape of the formic acid, thereby preventing its escape from the slidable seal system, where it may cause damage to other components of the system or merely be wasted.

In one embodiment of the present invention, a labyrinth seal system for sealing a thermo-compression bonding chamber is disclosed. Such a chamber comprises a substrate bond station, comprising a substrate bonding surface and a substrate bond chamber perimeter, offset from the substrate bonding surface in the two axis occupied by the plane defined by the substrate bonding surface. The substrate bond station further comprises at least two substantially parallel extensions, adjacent to the substrate bond chamber perimeter and oriented orthogonally to the plane defined by the substrate bonding surface. The system also comprises a die bond head system further comprising a die bonding surface and a die bond chamber perimeter, offset from the die bonding surface in the two axis occupied by the plane defined by the die bonding surface, wherein the die bonding surface is substantially co-planar with the substrate bonding surface, the die bond station further comprising at least two substantially parallel extensions adjacent to the die bond chamber perimeter and oriented orthogonally to the plane defined by the die bonding surface. The substantially parallel extensions of the die bond station are offset from and oppose the parallel extensions of the substrate bonding surface such that when the substrate bonding surface and the die bonding surface are brought proximal to one another, the opposing parallel extensions interlock, forming a labyrinth passage therebetween. In some embodiments, there may also be included inlets for introduction of a fluid or for placing the now sealed bonding chamber, sealed by the labyrinth sealing arrangement, under a vacuum. Some such inlets may be in communication with the sealed chamber directly, while others may be in indirect communication with the sealed chamber, via a direct connection to the labyrinth passageways formed by the labyrinth seal.

In use, bonding would begin by positioning at least work piece to be acted upon on the substrate bonding surface and positioning at least one work piece to be acted upon on the die bonding surface. Next, the substrate and die bonding surfaces would be positioned proximally to one another. When the aforementioned surfaces are adjacent, one or more fluids from at least one fluid source may be introduced to the bond chamber directly or through a passageway in communication with the labyrinth passageway. In some embodiments a vacuum may be introduced as well via either of the aforementioned passageways. The last step to using the labyrinth seal system for thermo-compression bonding is conducting a bonding process and ceasing displacement of the at least one fluid, or vacuum, and removing the bonded work piece.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 8 is a right side section view of a gantry, a force applicator, a die bond head system and a substrate bond station, including various subsystems, in accordance with one embodiment of the present invention.

FIG. 14 is a front section view of a rapid transition thermal management system showing the cooling passages and heater cavities in accordance with one embodiment of the present invention.

FIG. 15 is a bottom, left side perspective view of a rapid transition thermal management system showing the plurality of intersecting passages adjacent the second surface of the rapid transition thermal management system, in accordance with one embodiment of the present invention.

DETAILED DESCRIPTION OF THE INVENTION

Figure 1:
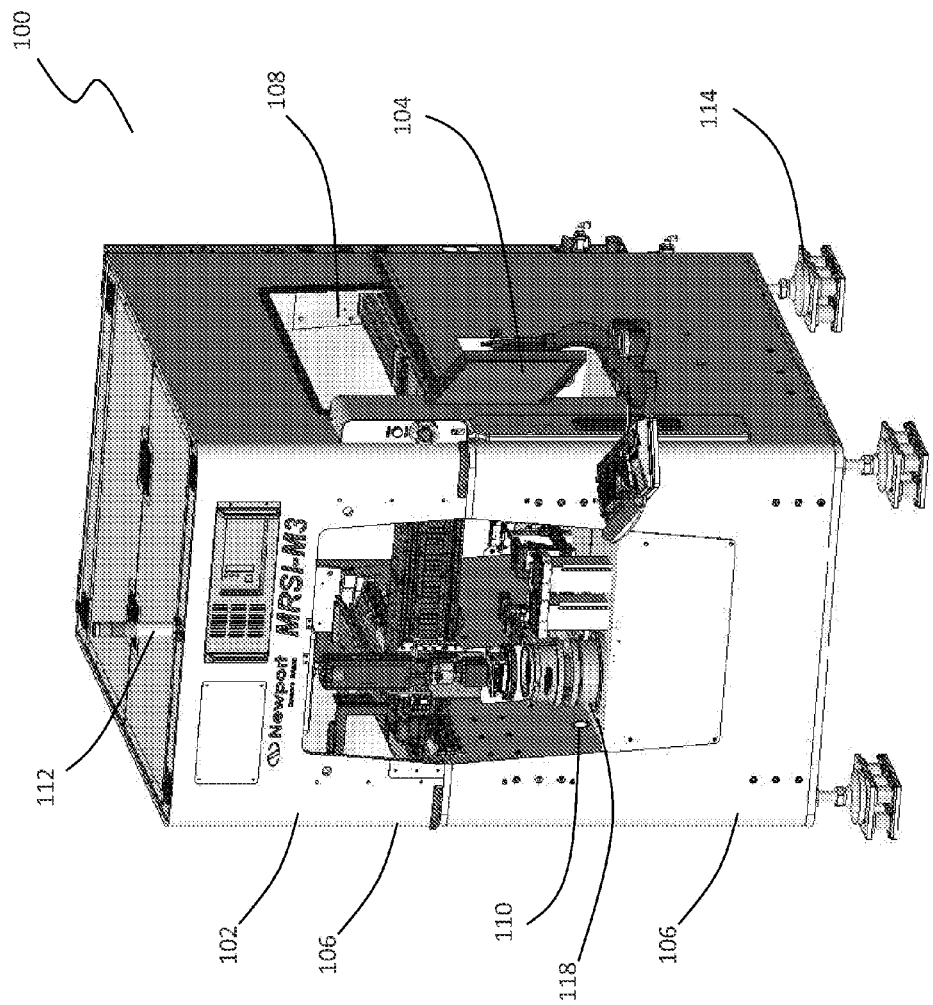
FIG. 1 is a top, left side perspective view of a thermo-compression bonding system in accordance with one embodiment of the present invention.

FIG. 1 shows an embodiment of a thermo-compression bonding system. As shown in FIG. 1, the thermo-compression bonding system 100 includes a housing 102 having at least one controller or user interface 104 in communication therewith. Exemplary controllers include, without limitations, computers, processors, buttons, switches, joysticks, user-actuated devices, and the like. Optionally, the controller 104 may be in physical communication with the housing 102 or may communicate with at least one component within the housing 102 via at least one conduit, computer network, or wireless network.

Referring again to FIG. 1, the housing 102 may comprise one or more body panels 106 which cooperatively form the housing 102. In another embodiment, the housing 102 may comprise a monolithic structure. Various materials may be used to form at least a portion of the housing 102. Exemplary materials include, without limitations, steel, aluminum, composites, fiberglass, polymers, alloys, and the like. Further, the housing 102 may include one or more material passages 108 formed therein, the material passages 108 permitting components or materials to be processed to be positioned within and evacuated from the interior portion of the housing 102. As such, various material handling systems and devices known in the art may be included within the housing 102 or positioned proximate thereto. Exemplary material handling systems include, without limitations, belt systems, guides, substrate/component positioning systems, tray holders, robotic material loading systems, and the like. In addition, at least one access area 110 may be formed in the housing 102 of the thermo-compression bonding system 100, thereby permitting a user to access and/or view the internal components of the thermo-compression bonding system 100. In another embodiment, housing 102 may be formed without having at least one of the material passage 108 and/or access area 110 formed therein.

As shown in FIG. 1, at least one indicator 112 may be positioned on or otherwise be in communication with at least one component positioned within or otherwise in communication with the housing 102. For example, the indicator 112 may be in communication with the controller 104. During use, the indicator 112 may be used to indicate various aspects of the thermo-compression bonding procedure being conducted by the thermo-compression bonding system 100.

Referring again to FIG. 1, one or more supports 114 may be coupled or otherwise in communication with the housing 102. For example, in one embodiment, the supports 114 are coupled to an exterior surface of the housing 102. In another embodiment, the supports 114 may be coupled to or otherwise in communication with a frame and support structure (not shown) positioned within the housing 102 or positioned outside the housing 102. In one embodiment, the supports 114 comprise support frames configured to support and elevate the housing 102 from a work surface such as a floor, deck, or similar surface. In another embodiment, the at least one of the supports 114 comprises a vibration isolation device configured to isolate the thermo-compression bonding system 100 from vibrations of the work surface. In still another embodiment, the support 114 may include a vibration damper configured to damp any vibration transmitted from the work surface to the thermo-compression bonding system 100. Optionally, the supports 114 may be configured to isolate the thermo-compression bonding system 100 from vibrations, electric or static charge, environmental conditions, structural conditions, and the like present in or on the work surface support the thermo-compression bonding system 100.

Figure 2:
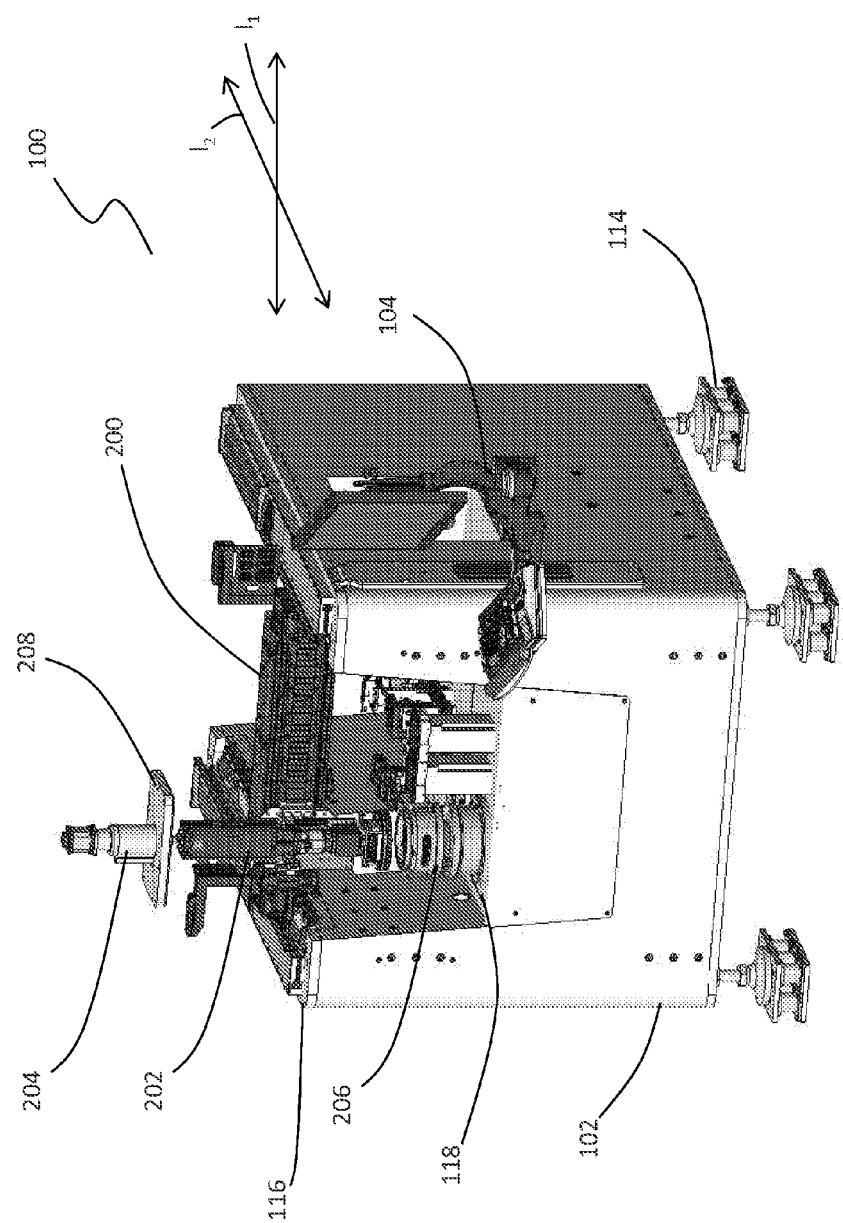
FIG. 2 is a top, left side perspective view of the thermo-compression bonding system of FIG. 1, wherein body panels are removed to expose at least a portion of the internal components of the thermo-compression bonding system.

Referring to FIGS. 1-2, these figures show various views of an embodiment of a thermo-compression bonding system 100 having at least one body panel 106 removed therefrom, thereby exposing at least a portion of the internal components of the thermo-compression bonding system 100. As shown, the thermo-compression bonding system 100 may include at least one gantry or movable framework 200 positioned within the housing 102. The gantry 200 may be coupled to a support frame 116 positioned on or within the housing 102. The gantry 200 includes a first gantry positioner (not shown) and at least a second gantry positioner (not shown). The first gantry positioner (not shown) permits movement of the gantry 200 along a first line $I_1$ (X axis), while the second gantry positioner (not shown) permits movement of at least a portion of the gantry 200 along a second line $I_2$ (Y axis). As shown in FIG. 2, the first line $I_1$ and second line $I_2$ are orthogonal. Optionally, first and second lines $I_1$, $I_2$, respectively, need not be orthogonal. As such, the first and second gantry positioners (not shown), enable multi-axial movement of components coupled to the gantry 200. Any variety of devices may be used to form the gantry 200, the first gantry positioner (not shown), and/or the second gantry positioner (not shown). For example, in one embodiment, the first and second gantry positioners (not shown) comprise linear motors. In another embodiment, the first and second gantry positioners (not shown) comprise air bearings. Optionally, the any variety of devices may be used to form the gantry 200, the first gantry positioner (not shown), and/or the second gantry positioner (not shown), including, without limitation, pneumatic drives, screw drives, piezo actuators, electro-mechanical positioners, and the like.

Referring again to FIGS. 1-2, at least one die bond head system 202 having at least one force applicator 204 coupled thereto and at least one substrate bond station 206 are positioned within the housing 102. In the illustrated embodiment a single die bond head system 202 is coupled to a single substrate bond station 206. Optionally, any number of die bond head systems 202 may be included within the thermo-compression bonding system 100. Similarly, any number of substrate bond stations 206 may be included in the thermo-compression bonding system 100.

In the embodiment shown in FIGS. 1-2, the position of the substrate bond station 206 may be fixed while the die bond head system 202 is coupled to the gantry 200, thereby permitting the die bond head system 202 to be selectively positioned with respect to the substrate bond station 206. In another embodiment, the position of the die bond head system 202 may be fixed while the substrate bond station 206 is selectively positioned with respect to the die bond head system 202 and force applicator 204. Optionally, both the die bond head system 202 and the substrate bond station 206 may be independently movable.

Further, the thermo-compression bonding system 100 may include any number and variety of additional subsystems therein. For example, in one embodiment, the thermo-compression bonding system 100 includes one or more material handling systems (not shown) configured to retrieve and/or place one or more substrates and/or components on at least one of the die bond head system 202 and the substrate bond station 206. Exemplary material handling systems include, without limitations, robotics systems, air bearings, belts, tray loading systems, and the like. In another embodiment, the thermo-compression bonding system 100 may include one or more substrate and/or component heating subsystems configured to heat the substrate and/or component prior to placement on the die bond head system 202 and/or substrate bond station 206 or following the bonding process. In another embodiment, the thermo-compression bonding system may include one or more substrate and/or component cleaning systems configured to pre-clean the substrate and/or components. For example, the cleaning system may be configured to limit or eliminate the formation of oxides on the components and/or substrates. In short, the thermo-compression bonding system 100 may comprise a modular system wherein the number and variety of various subsystems, head systems, cameras systems, and the like may be easily added and/or removed from the system.

Co-Planarity Adjustment System

The design of the thermo-compression bonding system 100 responsible for ensuring co-planarity between the die head thermal control system body 700, located on the die bond head system 202 and the substrate head thermal control system body 500, located on the substrate bond station 206, in one embodiment, uses the concept of a master and a slave plane.

Figure 3:
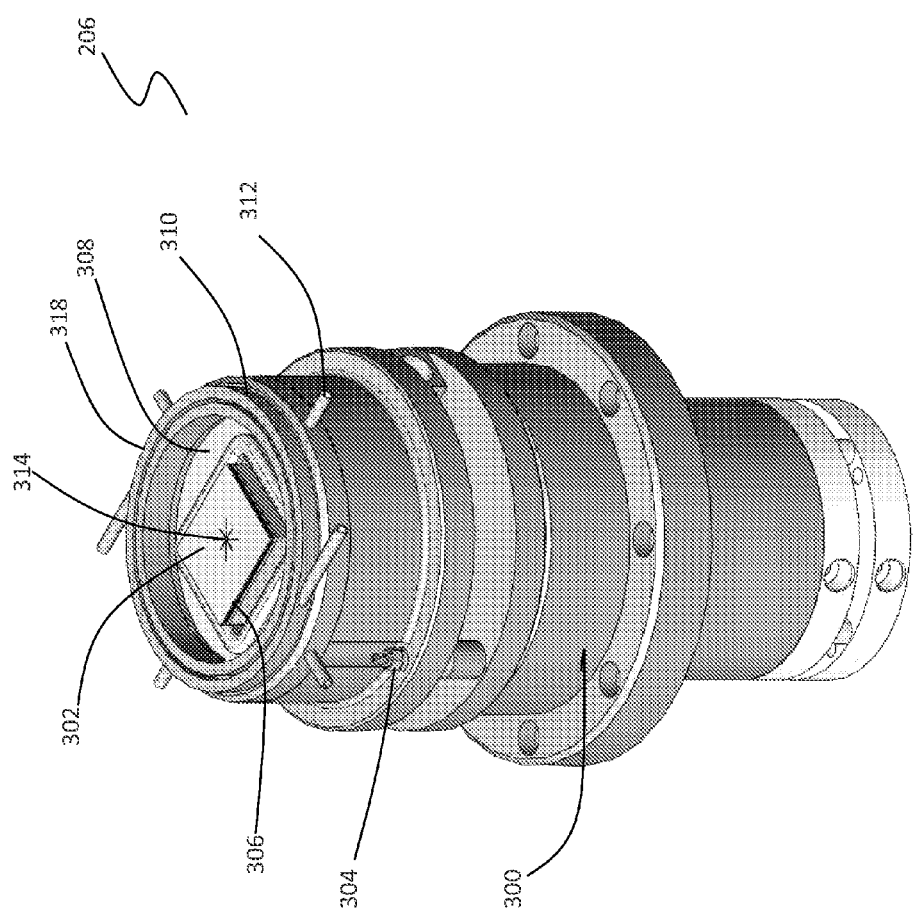
FIG. 3 is a front elevation view of a substrate bond station in accordance with one embodiment of the present invention.
Figure 4:
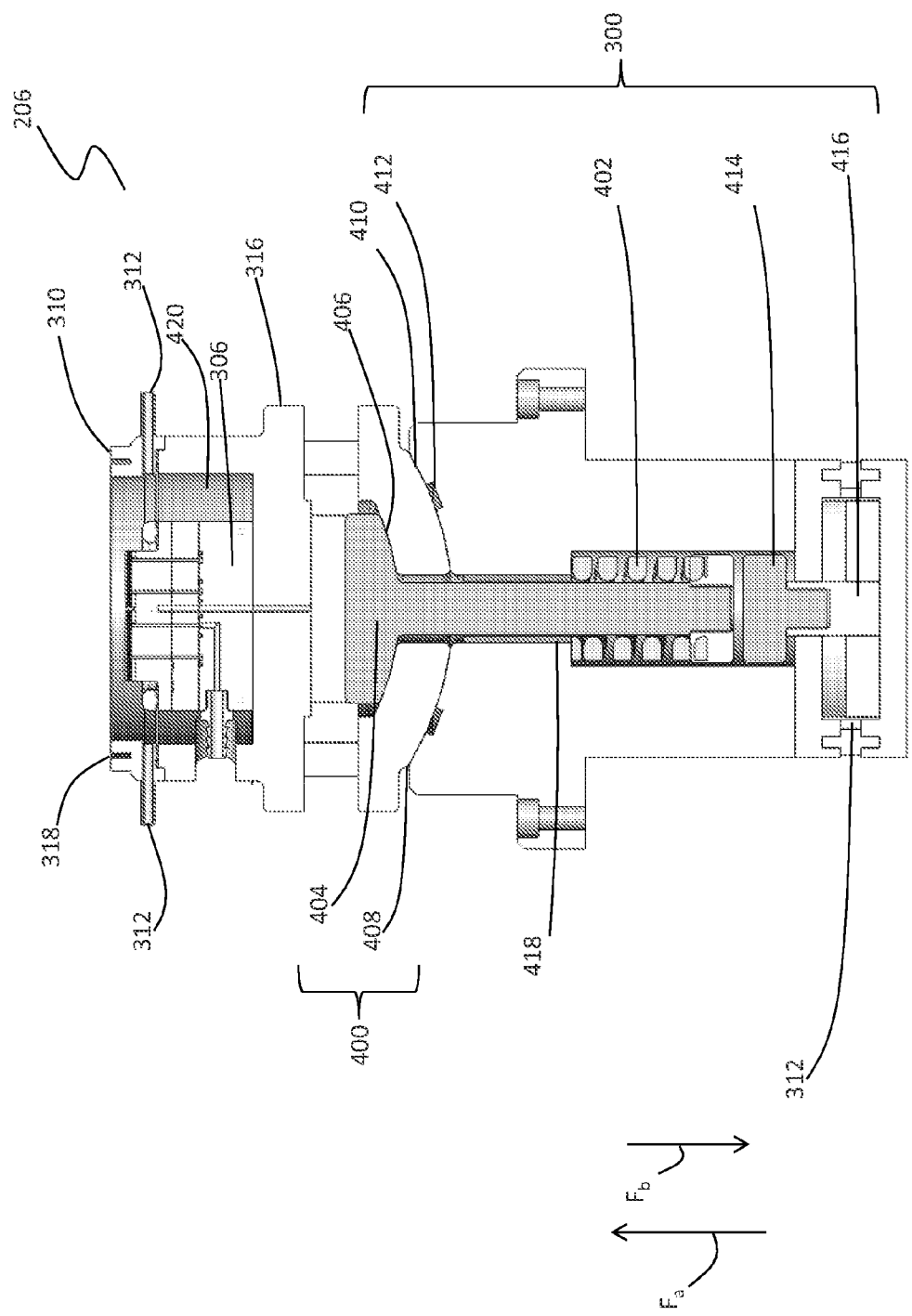
FIG. 4 is a front section view of the embodiment of the substrate bond station of FIG. 3.

With reference to FIGS. 3-4, the master plane is defined by the die head thermal control system body 700 and the slave plane is defined by the substrate head thermal control system body 500. To maintain simplicity and gantry platform robustness it is desirable to put the remaining 2 degrees of freedom on the station that holds the substrate. The additional two degrees of freedom on the slave plane, in embodiments, are achieved by using a spherical joint 400 that can be 'unlocked' to a compliant state, to allow it to conform to the master plane. Once the master and slave planes conform, the spherical joint 400 is locked to ensure the master/slave planarity is maintained. Those skilled in the art will appreciate that any variety of devices may be used to enable such functionality and that the location of each component may be altered without significantly altering the functionality of such components.

In one embodiment, the spherical joint 400 is a spherical air bearing. When the system is pressurized, a second spherical surface 410 of the spherical joint 400 is separated from an engaging face 412 of the same, which allows for two degrees of freedom in the spherical joint 400. By subjecting the air bearing to vacuum, the setting can be locked.

In another embodiment of the present invention, as shown in FIGS. 3-4, an alignment body 404 disengages from a first spherical surface 406 on the alignment body support 408 thereby permitting the alignment body support 408 to freely move. For example, in one embodiment the second spherical surface 410 of the alignment body 404 is movable in relation to the engaging face 412. Optionally, the interface between the second spherical surface 410 and the engaging face 412 comprises a fluid bearing.

Further embodiments, shown in FIGS. 3-4, incorporate a biasing member 402, which applies a 300-400 pound downward force to a first spherical surface 406 of the spherical bearing, pressing a second spherical surface 410 and an engaging face 412 of the spherical joint 400 together, thus preventing unwanted movement of the two halves of the bearing, even when the system is switched off or during high force operation. The pressure generated by the biasing member is typically overcome by the same pressure used to actuate the spherical air bearing. After application of air pressure to the air bearing and alignment body, unlocking the spherical joint 400, the bond head will apply a calibration force, ideally the same force used in the specific thermo-compression bonding operation to be conducted, to simulate the exact conditions as will be encountered in actual operation. This force must be at least enough to overcome any friction or cable forces. After the force has been applied and co-planarity has been achieved, the pressure is released and vacuum is applied to the spherical air bearing and biasing member, locking in the setting.

The die and substrate holding planes can be made co-planar as a part of the system setup, prior to running the system, or at a user defined frequency (time based or based on the number of parts run) during a production run, to ensure high reliability attach. This process should also be completed if components on the system are changed or adjusted during maintenance.

With regards to using the above-described system to obtain co-planar surfaces; with the spherical joint 400 unlocked the die bond head system 202 is positioned on top of the substrate bond station 206. The die bond head system 202 is then moved down in the Z axis, by the gantry 200, to bring the die and substrate holding planes into intimate contact. The gantry head then applies a preset force to ensure the substrate holder plane 'self aligns' to the die holder plane. The unlocked spherical joint 400 ensures that the planes are able to self-align.

With the gantry 200 pushing downwards in the Z-axis and forcing the die and substrate holder planes into a parallel relationship, the force generator 280, an air cylinder in some embodiments, is then retracted. The biasing member 402 then extends to its original length, pushing the forcer 414 down, in turn locking the spherical joint 400 in place. The gantry 200 may then release pressure from the substrate bond station 206.

Once co-planarity is achieved, the position of the substrate bond station 206 is fixed by controllably retracting the force generator 280 in the co-planarity system body thereby resulting in the alignment body 404 re-engaging the alignment body support 408. A biasing force is applied to the alignment body support 408 via the alignment body 404 by the biasing member 402, a die spring in some embodiments. Those skilled in the art will appreciate that any variety of alternate devices and systems may be used to fix the position of the substrate bond station 206. For example, mechanical systems, magnetic systems, vacuum systems, pneumatic systems, and/or any combination thereof may be used to fix the position of the substrate bond station 206 to ensure co-planarity.

In one embodiment, the force generator 416 comprises at least one air cylinder or air bearing. Those skilled in the art will appreciate that any variety of devices may be used to form the force generator 280.

This process of adjusting the orientation of the slave plane to that of the master plane may be a set-up or calibration procedure ahead of production runs.

Gantry without Moment Loading

Figure 5:
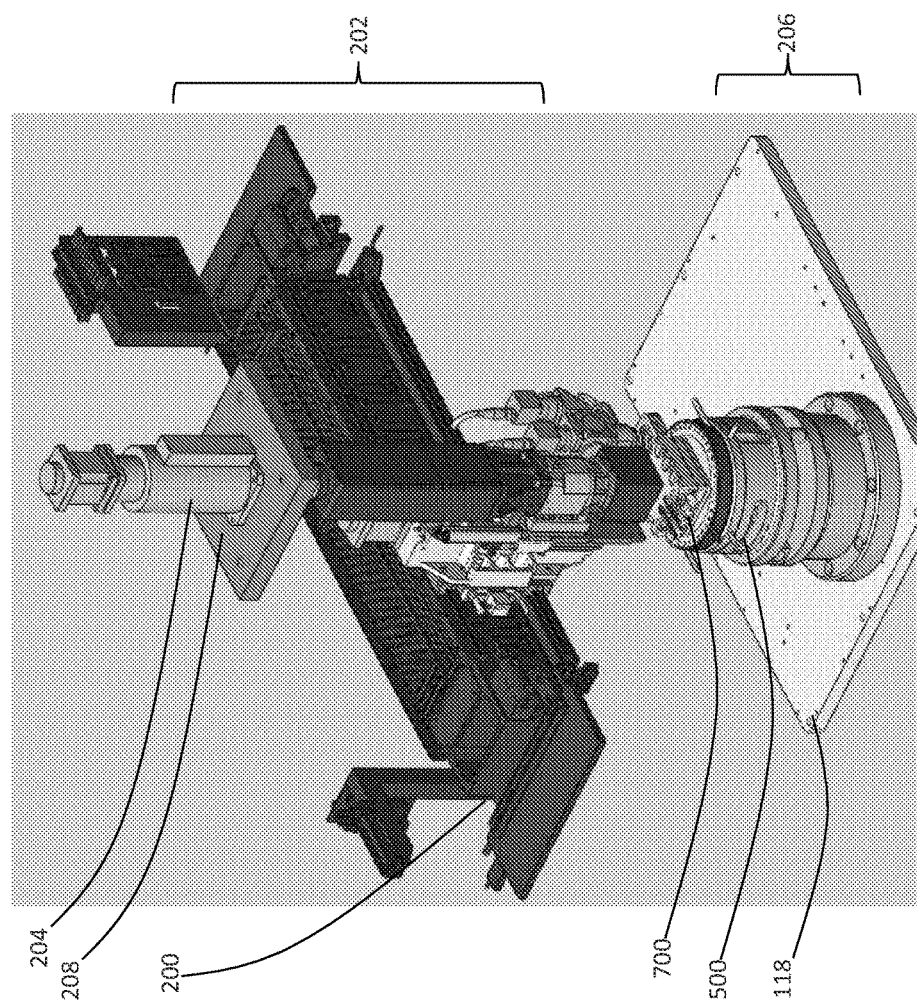
FIG. 5 is a front, right side perspective view of a gantry, a force applicator, a die bond head system and a substrate bond station, including various subsystems, in accordance with one embodiment of the present invention.
Figure 7:
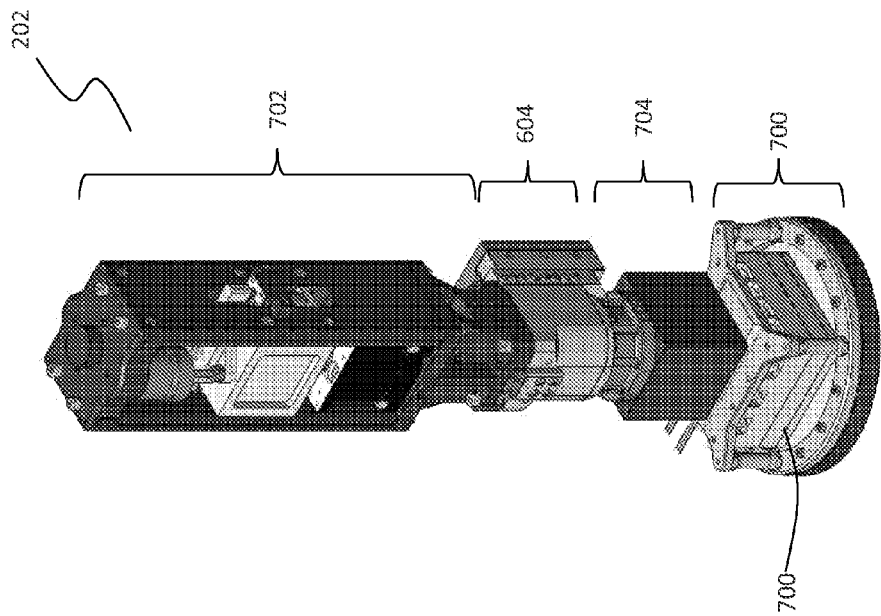
FIG. 7 is a front, left side perspective view of a die bond head system in accordance with one embodiment of the present invention.

FIG. 5 shows an embodiment of a thermo-compression bonding subsystem, a gantry capable of high force application without moment loading.

FIGS. 5-9 show detailed views of the interface of the gantry 200 and the placement head body 702 as well as additional embodiments and features. As shown, the gantry 200 includes at least one placement head body support 602 configured to have at least a portion of the placement head 70 coupled thereto. The placement head body support 110 includes at least one slide assembly 604 positioned thereon. In the illustrated embodiment, the slide assembly 604 enables the placement head body 702 to move along the line $l_3$, which is substantially parallel to the longitudinal axis of the thermo-compression bonding system. More succinctly stated, the slide system 604 enables movement of the placement head system 702 along the Z axis relative to the X axis and Y axis described above. As such, components or devises engaged by or retained by the die bond head system 202 may be moved in the XYZ and theta planes (as such, four (4) degrees of freedom) via the first gantry positioner (not shown), second gantry positioner (not shown), the motor 908 (see FIG. 9), and the z slide system 604 (see FIG. 6).

Referring again to FIGS. 5-9, the slide assembly 604 may include a slide assembly housing 802 having at least one drive motor 804 therein. In one embodiment, the drive motor 804 comprises an electro-mechanical drive. Optionally, the drive motor 804 may comprise a linear motor, pneumatic drive system, and the like. Further, the slide assembly housing 802 may include one or more drive tracks 806 thereon, the drive track 120 configure to movably engage at least one placement head track 808 on the placement head body 702. During use, the drive motor 804 receives at least one control signal from the controller 104 (See FIG. 1) and reacts in response thereto, resulting in movement of the placement head track 808 supporting the placement head body 702 relative to the drive track 120. As such, movement of the placement head body 702 along the Z axis may be achieved.

In one embodiment, a force applicator 204 is detachably coupled to die bond head system 202. The force applicator 204 may be configured to provide precise, incremental displacement control of the die head thermal control system body 700. As such, the force applicator 204 may be coupled to a support member 208 positioned within the housing 102. Optionally, the support member 208 may be coupled to or integral to support framework (not shown) formed within the housing 102. In another embodiment, the force applicator 204 may alternatively be non-detachably coupled to the die bond head system 202.

Figure 6:
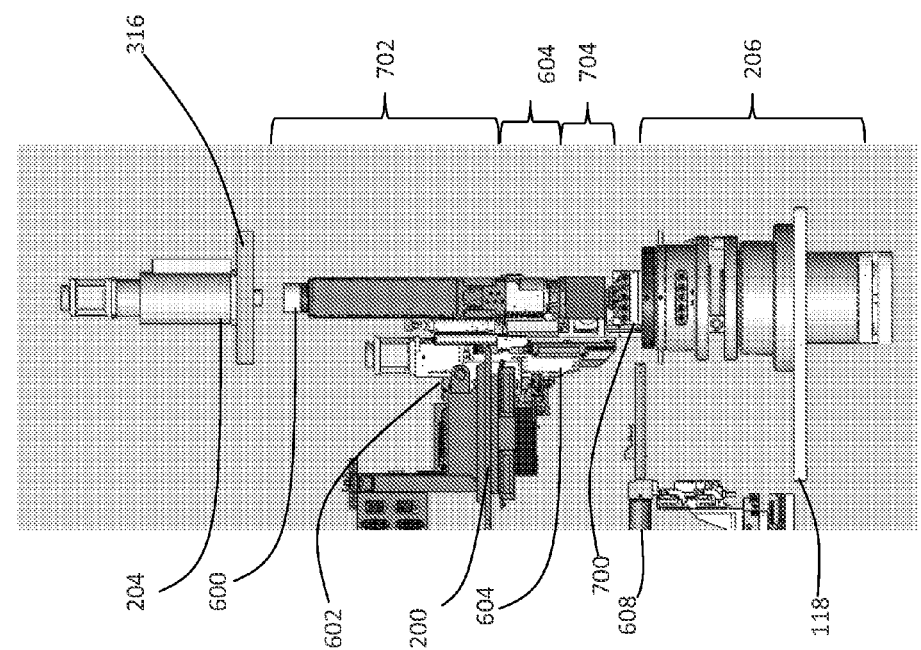
FIG. 6 is a right side view of a gantry, a force applicator, a die bond head system and a substrate bond station, including various subsystems, in accordance with one embodiment of the present invention.

Referring now to FIG. 6, a force applicator receiver 600 is configured to receive and/or engage at least a portion of the force applicator 204, thereby permitting the force from the force applicator 204 to be transferred to the force rod 800 via the load cell 900. Optionally, one or more auxiliary force applicator receivers (not shown) may be formed on at least a portion of the placement head body 702. Like the force applicator receiver 600, the auxiliary force applicator receiver (not shown) may be configured to have any variety of force applicators 900 coupled thereto thereby enabling the force from the force applicator 204 to be transferred to the force rod 800 via the load cell 900.

In further embodiments, as shown in FIGS. 5-9, a load cell 900 is used to measure the force applied. The load cell 900 can also be used to enable the thermo-compression bonding system 100 to detect contact between a die and substrate. In one embodiment, the load cell 900 comprises a piezo actuated device, although those skilled in the art will appreciate that any variety of devices may be used to form the load cell 900.

Still further embodiments incorporate an overload protection system, analogous to a fuse in an electrical circuit. Embodiments of the present invention utilize an air cylinder arrangement, which will collapse should a set force be exceeded, to accomplish this. Such an air cylinder may be located either within the die bond head system or the substrate bond station 206.

Referring still to FIGS. 5-9, at least one load cell 900 may be positioned within the placement head body 702. In one embodiment, the load cell 900 comprises a piezo actuated device, although those skilled in the art will appreciate that any variety of devices may be used to form the load cell 900. For example, the load cell 900 may comprise electro-mechanical devices, pneumatic devices, and the like.

During use, the load cell 900 may be actively monitored via any number of load sensors 304 or others similar devices located within or proximate to the load cell 900. For example, the controller 104 may be in communication with the load cell 900 to actively monitor the force or load ramps being selectively applied by the force rod 800 by the force applicator 204 (See FIG. 2). As such, the load cell 900 may be coupled to the force rod 800 with one or more load couplers 902. Optionally, at least one load cell 900 may be directly coupled to at least one force applicator 204. Further, optionally, any number of load cells 90 may be located anywhere within the thermo-compression bonding system 100 (See FIG. 1). In the illustrated embodiment, the load cell 900 is positioned with or proximate to at least one load cell support 904, the load cell support 904 configured to position the load cell 900 at a desired location within the placement head body 702.

Figure 9:
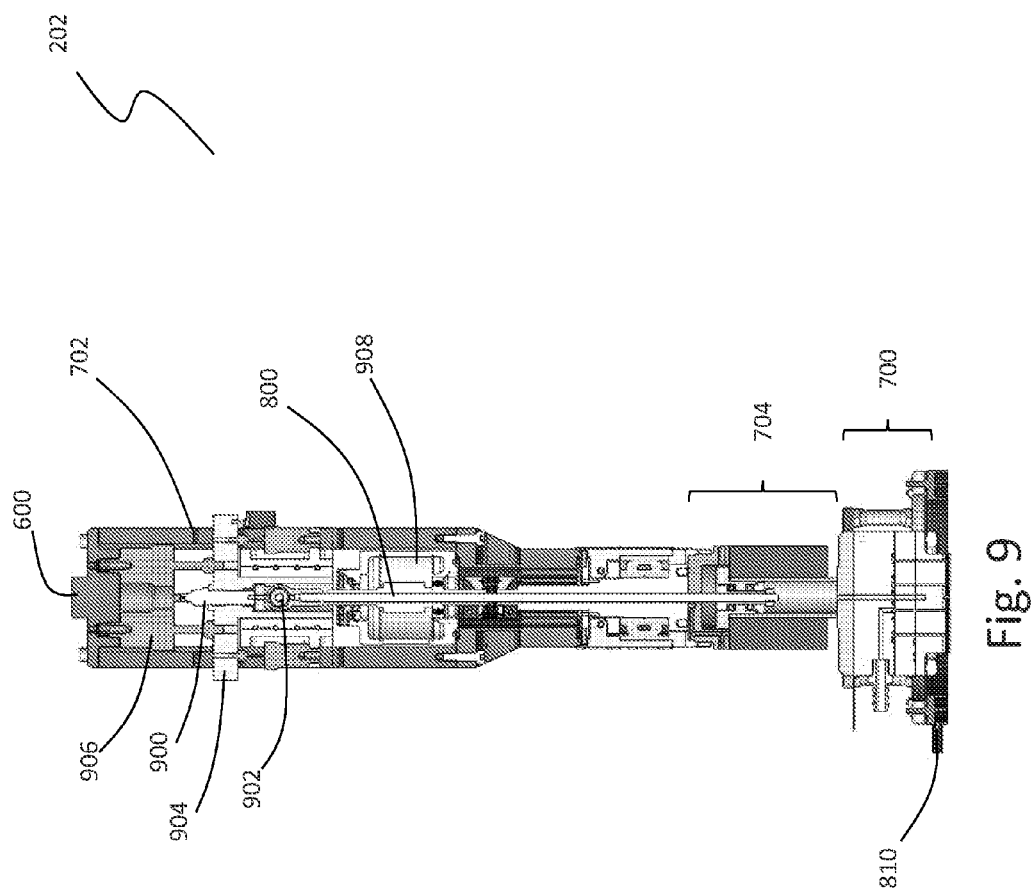
FIG. 9 is a front section view of a die bond head system in accordance with one embodiment of the present invention.

In the embodiment illustrated in FIG. 9, the load sensors 304 are positioned on the load cell support 904 and placement head body 702. Optionally, those skilled in the art will appreciate that the load sensors 304 may be located anywhere on the placement head body 702 or the die bond head system 202. Optionally, load sensors 304 may be similarly positioned on the substrate bond station 206. In another embodiment, the load cell 900 and load sensor 304 may be configured to provide information to the controller 104. For example, the load cells 900 and load sensor 304 and at least one encoder (not shown) may be used to provide force and distance data to the controller 104, thereby enabling detection of various conditions, including, for example, melt sensing or detection.

Heating and Cooling System

Figure 16:
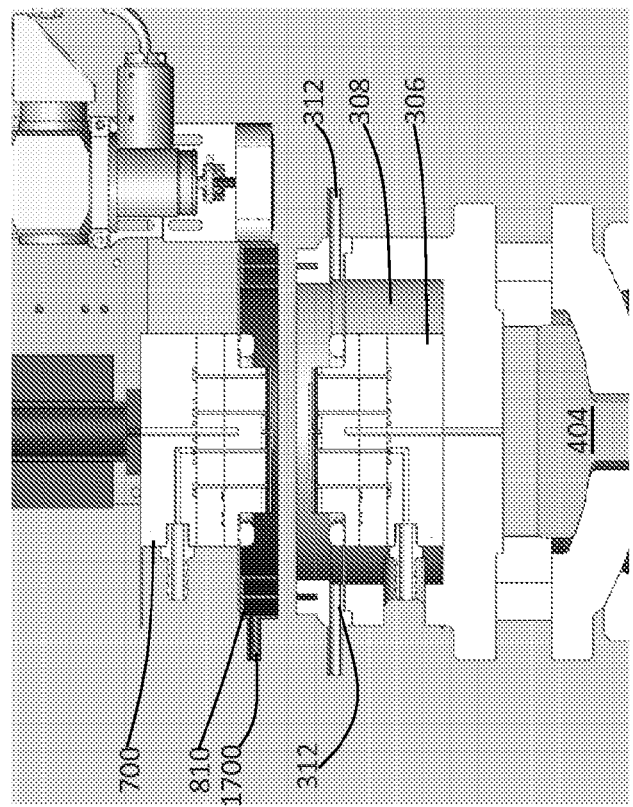
FIG. 16 is a section view of a die bond head system adjacent to a substrate bond station, particularly showing seal extensions fixed to each component, offset from one another such that, when brought more closely together, they interlock, forming a labyrinth seal, in accordance with one embodiment of the present invention.

In one embodiment, as illustrated in FIGS. 16, at least one of the die head thermal control system body 700, substrate head thermal control system body 500 and bonding fixture 306 is configured to provide heat to at least one of a die supported by the die head thermal control system body 700 and a substrate positioned on or in close proximity to the bonding fixture 306 thereby controllably coupling the die to the substrate. In one embodiment, at least one of the die head thermal control system body 700, substrate head thermal control system body 500 and bonding fixture 306 is uniformly heated or cooled.

Figure 10:
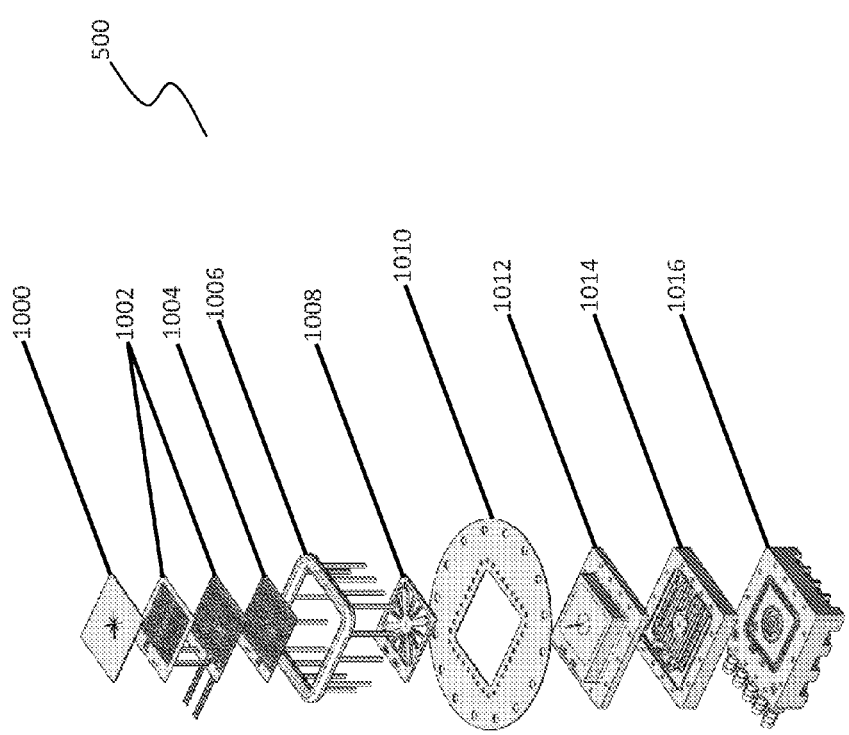
FIG. 10 is a front, left side exploded perspective view of a thermal control system body in accordance with one embodiment of the present invention.

Referring to FIG. 10, an exploded view of a substrate head thermal control system body 500 is shown. The substrate head thermal control system body 500 comprises a cover 1000, to transfer heat, a primary heater 1002, generally used for ramping temperatures, a secondary heater 1004, generally used for holding temperatures, a clamp 1006, for holding the system together, a cooling block 1008, for allowing airflow through the system, a seal 1010, for isolating the upper portion of the system, a main heater body 1012, a distribution block 1014, and a manifold or base 1016. These components can be made of any material having sufficient thermal and mechanical strength; however, in embodiments the cover 1000, primary heater 1002, cooling block 1008, and main heater body 1012 may be made of aluminum nitride. In other embodiments, the clamp 1006 is made of steel, the seal 1010 is made of polytetrafluoroethylene, the distribution block 1014 is made of aluminum oxide and the manifold or base 1016 is made of 7075-T6 aluminum. Those skilled in the art will appreciate that any number of materials could be used.

Figure 12:
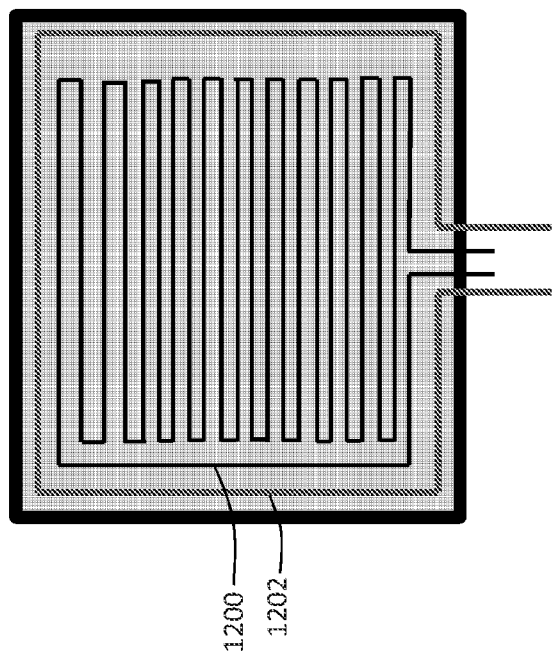
FIG. 12 is a top view of bonding fixture showing a heater with separate center and peripheral heater traces, providing differential heating and cooling capabilities in accordance with one embodiment of the present invention.
Figure 11:
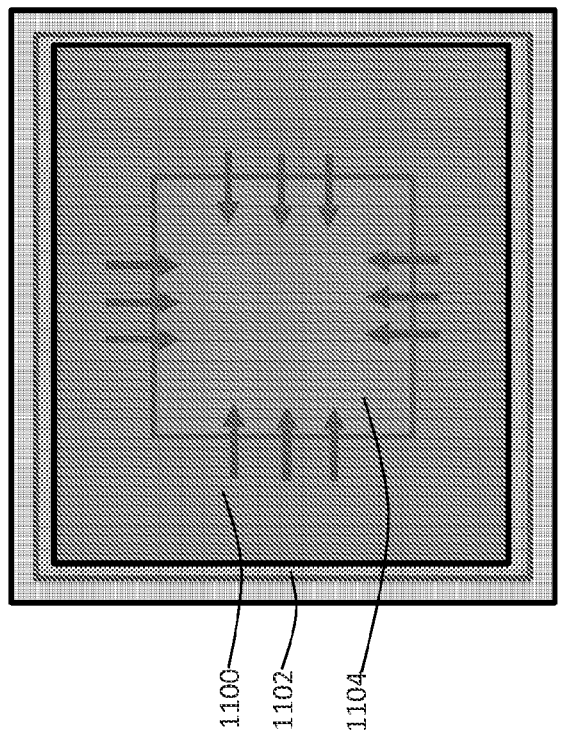
FIG. 11 is a top view of a bonding fixture showing a heater lacking heater traces in a central region, causing a centrally flowing heat flux to be produced and providing differential heating and cooling capabilities in accordance with one embodiment of the present invention.

Optionally, sections or regions of the substrate head thermal control system body 500 and die head thermal control system body 700 may be selectively heated or cooled. For example, FIGS. 11-12 show different embodiments of heaters configured to differentially heat regions of a substrate positioned on or proximate to the heater surface 302 positioned on the bonding fixture 306. As shown, a first thermal region 1100 and at least a second thermal region 1102 may be formed within the bonding fixture 306. As such, differential heating of portions of the substrate positioned on the heater surface 302 coupled the bonding fixture 306 may be accomplished. In one embodiment, a first thermal region 1100 is heated to a first temperature $T_1$ via a first conduit 1200 while a second thermal region 1102 is heated to a second temperature $T_2$ via a second conduit 1202 wherein $T_1$ is greater than $T_2$. In the alternative, the first thermal region 1100 may be heated to a first temperature $T_1$ via the first conduit 1200 while the second thermal region 1102 is heated to a second temperature $T_2$ via the second conduit 1202, wherein $T_2$ is greater than $T_1$. A typical conduit would be made of tungsten, while a typical thermal region in contact with a substrate would be made of aluminum nitride, however, any materials having sufficient conductivity, thermal stability, and substantially similar coefficients of thermal expansion could be used.

The embodiment depicted in FIG. 11 discloses a differential heating system wherein the heat is provided to at least one of the first thermal region 1100 and/or the second thermal region 1102 and permitted to flow via the thermal conductivity characteristics of a substrate positioned thereon to a central portion 1104 of the substrate. The size of the 'hole' can be selected to cater to a number of substrate die combinations where the die outer dimensions are similar.

In contrast, FIG. 12 shows an alternate embodiment of an exemplary differential heating system which includes a first thermal region 1100 formed by a first conduit 1200 and at least a second thermal region formed by at least a second conduit 1202. Those skilled in the art will appreciate that any number of thermal regions may be formed by any number of conduits coupled to or otherwise formed within at least one of the substrate head thermal control system body 500 or die head thermal control system body 700.

For certain applications, based on the device metallurgies it may be beneficial to maintain the die and substrate at a temperature differential during the bonding process. For reliable bonding the differential needs to be held at the desired value to minimize coefficient of thermal expansion mismatch issues.

In the previously described embodiments, heater traces or conduits placed adjacent to the periphery of a given heater may be used to add heat into the system in such a way that the center of the substrate is no longer hotter than surrounding material. This may be accomplished by varying the ratio of trim to main heater to force heat flow to flow into the center of the heater, rather than towards its edges. Some embodiments include thermocouples attached at various points to facilitate real-time monitoring. In a typical process, the main heater may be set between 50-100% of full power with the trim heater set to between 25% and 50% of full power. Alternatively, a heater with separately addressable concentric rings of traces or quadrant heaters, having individually addressable heating sections arranged in a grid, could also be employed.

In practice, the substrate heater may be kept slightly below its desired temperature set-point prior to bonding. After the die is placed on the substrate the bond head is ramped to its desired temperature. At the same time (or after a small dwell) the substrate heater is energized to elevate the substrate temperature to its desired set-point.

By design, the embodiments shown in FIGS. 11-12, force the substrate heat flux to flow inward from the substrate edges to the center while the bond head pushes heat outward from the die center towards the edges. This opposing heat flux phenomena is effective to smooth out the temperature gradients from the center of the die to the periphery, enabling superior uniformity of bonding of die to substrate.

Fluid Injection for Cooling

For thermo-compression bonding, a die and substrate need to be brought to their final bonding temperatures, while under compression, in order to join the solder bumps on the die to their corresponding metalized pad on a substrate. If the die and substrate are exposed to higher temperatures for prolonged durations it can cause issues, such as oxide creation, which can compromise the integrity of the bonded product. Thus, the ability to ramp temperatures up quickly to bonding temperatures is critical. Furthermore, once the bonding is completed the temperatures need to be brought down quickly in order to 'freeze' the components in place. The ability to ramp the temperature down quickly is therefore also a critical requirement. Since the time to ramp temperatures up and down are a part of the overall bonding cycle time, the ability to ramp temperatures up and down quickly also contributes to a reduction in the overall cycle time.

Figure 13:
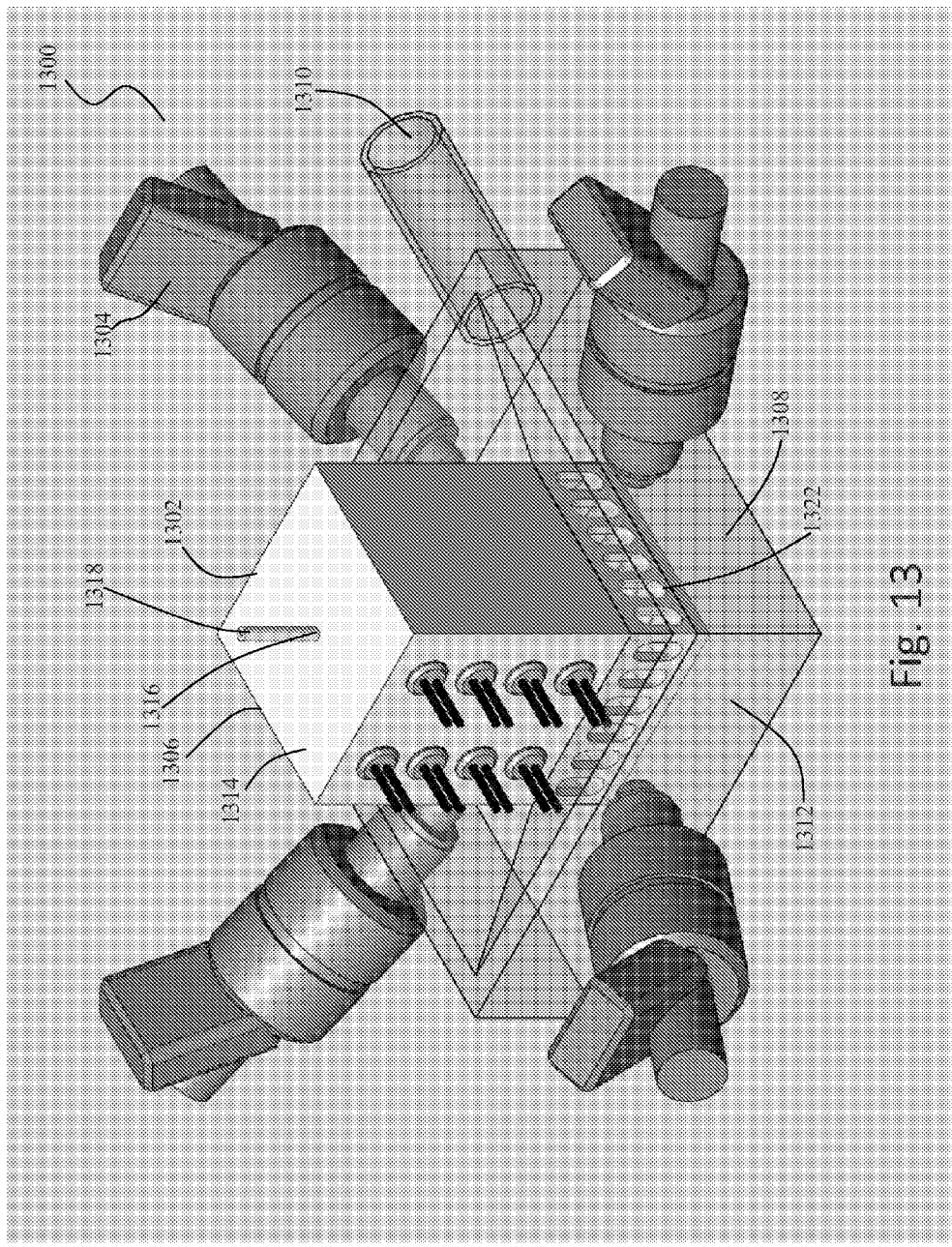
FIG. 13 is a top, left side perspective view of a rapid transition thermal management system in accordance with one embodiment of the present invention.

FIGS. 13-15 show various views of an embodiment of a rapid transition thermal management system 1300 adapted for use in manufacturing applications. More specifically, the rapid transition thermal management system 1300 shown in FIGS. 13-15 is well suited for use in thermal compression bonding applications. In other embodiments, the rapid transition thermal management system 1300 disclosed herein is useful in the manufacture of advanced microelectronic packages and devices. Optionally, the rapid transition thermal management system 1300 disclosed herein may be used in die bonding applications, biotechnology applications, and the like.

As shown in FIGS. 13-15, the rapid transition thermal management system 1300 includes at least one heater device 1302 having at least one injector 1304 positioned proximate thereto. In the embodiment shown in FIG. 1, four injectors 1304 are positioned proximate to the heater body 1306 of the heater device. In another embodiment, a single injector 1304 may be used. Optionally, any number of injectors 14 may be used with the present system. The injectors 1304 may be in fluid communication with one or more sources of fluid, one or more pumps, pressure regulators, flow meters, sensors, and the like. Exemplary fluids include, without limitations, water, coolants, gases, viscous materials, and the like. Further, one or more pumps or similar devices may be used to pressurize the fluids injected into the heater body 1306 of the heater device 1302.

Referring again to FIGS. 13-15, at least one manifold 1308 may be positioned on or proximate to the heater body 1306 of the heater device 1302. In one embodiment, the manifold is coupled to the heater body 1306 in a sealed relation. As such, fluids or coolants introduced into the heater body 1306 by the injectors 1304 may contained therein. Further, the manifold 1308 may include one or more exhaust passages 1310 thereon, thereby permitting fluids or coolants to be evacuated from the heater body 1306 during use. An interior portion of the manifold 1308 may define a fluid or coolant region or reservoir 1312 therein. Further, the exhaust passage 1310 may be coupled to an external collection reservoir, evacuation pump, or other system (not shown) configured to evacuate and/or collect the coolant injected by the injectors 1304 and contained within the coolant reservoir formed in the manifold 1308.

Referring still to FIGS. 13-15, the heater body 1306 may comprise a monolithic body formed from any variety of materials. Exemplary materials include, without limitations, aluminum, copper, copper-tungsten alloys, various metals, alloys, ceramic materials or coatings, composite materials, and the like. Optionally, the heater body 1306 may be manufactured from one or more materials and, as such, the heater body 1306 may comprise a laminar structure. In one embodiment, the heater body 1306 is manufactured from a material having a high thermal conductivity.

Referring again to FIGS. 13-15, the heater body 1306 includes a first surface 1314 thereon. At least one passage or lumen 1316 may be formed on the first surface 1314 of the heater body 1306. In one embodiment, the lumen 1316 traverse through the heater body 1306 and is in communication with a second surface 1400 formed on the heater body 1306, the second surface 1400 formed distally from the first surface 1314. Optionally, as shown in FIGS. 1-3, the lumen or passage may include at least one passage extension 1318 which extends from at least one of the first surface 1314 and/or second surface 1400. Optionally, the passage extension 1318 may include one or more coupling devices, threads, or the like formed thereon, thereby permitting the passage extension 1318 to be coupled to an external component (not shown). In one embodiment, the passage extension 1318 may be coupled to an external vacuum source (not shown), thereby permitting a vacuum force to be applied to a device or component positioned proximate to the second surface 1400 of the heater body 1306. For example, in one embodiment the vacuum force applied via the passage 34 of the heater body 1306 proximate to the second surface 1400 may be used to selectively couple one or more die, substrates, or components to the second surface 1400 of the heater body 1306. As such, optionally, the second surface 1400 may include one or more features, indents, features, fiducials, registrations, or the like thereon to aid in positioning and retaining at least one component thereon.

Still again referring to FIGS. 13-15, the heater body 1306 may include one or more insert receivers 1320 formed on at least one sidewall 1402. As shown in FIGS. 1 and 2, the one or more heater inserts 1404 may be positioned within the insert receivers 1320 (See FIG. 3) formed on the sidewall 1402. In one embodiment, the heater inserts 1404 comprise ceramic heaters. Optionally, the heater inserts 1404 may comprise propane heating devices or induction heaters. In short, any variety of heating devices may be used as heater inserts 1404. Further, any number of insert receivers 1320 may be formed on the heater body 1306, the insert receivers 1320 configured to receive any number of heater inserts 1404 therein. Optionally, the insert receivers 1320 may traverse the heater body 1306 or, in the alternative, may terminate within the heater body 1306.

As shown in FIG. 13-15, one or more cooling passages 1322 may be formed in the heater body 1306. In the illustrate embodiment the cooling passages 1322 are formed on the heater body 1306 proximate to the second surface 1400. Optionally, the cooling passages 1322 may be formed anywhere on the heater body 1306. Further, the cooling passages traverse the heater body 1306. Optionally, the cooling passages 1322 may terminate within the heater body 1306. Further, the cooling passages may be formed one any surface of the heater body 1306. For example, as shown in FIG. 2, the cooling passages 1322 may be positioned proximate to the second surface 1400 of the heater body 1306 and configured to be positioned proximate to the cooling region 1312 formed in the manifold 1308. As such, during use, coolants injected into the manifold 1308 by the injectors 14 may flow through the various coolant passages 1322 formed in the heater body 1306. Additional embodiments could also use a variety of fluids to provide supplemental heating through these same channels.

As shown in FIGS. 13-15, the cooling passages 1322 may be formed having one passage walls 1500 which may intersect neighboring cooling passages 1322. As such, the various intersecting channels configured to receive coolant therein may be formed by the cooling passages 1322 formed in the heater body 1306. As shown in FIG. 4, the cooling passages 1322 may be similarly sized. In the alternative, the various cooling passages be of varying sizes. The formation of the cooling passage exposing the passage walls 1500 greatly increases the surface area of the heater body 1306, thereby increasing the thermal exchange between the heater body 1306 and the coolant flowing through the cooling passages 1322.

During use, the rapid transition thermal management system 1300 described herein may be used with any variety of assembly systems, including thermo-compression bonding systems as well as a wide variety of pick and place die bonding systems, microelectronic packaging systems, and the like.

Once positioned within the assembly system, the injectors 14 are coupled to source of coolant (not shown) and the exhaust passage 18 is coupled to an external collection reservoir (not shown). Lastly, at least one of the lumens 34 and/or passage extensions 50 (if present) may be coupled to at least one vacuum source (not shown).

To initiate thermo-compression bonding, with the rapid transition thermal management system 1300 coupled to the assembly system, the heater body 1306 of the rapid transition thermal management system 1300 is heated to a desired temperature by activating the heater inserts 1404 located within the insert receivers 1320. As such, the second surface 1400 of the heater body 1306 may be configured to remain at an elevated temperature, thereby heating a die, substrate, and/or component coupled to the second surface 1400 of the heater body 1306 to a desired temperature. For example, the heater body 1306 and the second surface 1400 of the heater body 1306 may be configured to remain at a temperature of about 600° C. As such, the heater body 1306 may be configured to operate as a thermal reservoir. Further, the temperature of the second surface 1400 of the heater body 1306, and the die, substrate, and/or component coupled to the second surface 1400 of the heater body 1306, may be easily and controllably lowered by flowing coolant through the injectors 14 and into the cooling passages 1322 formed in the heater body 40. For example, the flow of coolant through the cooling passages 1322 may reduce the temperature of the second surface 1400 of the heater body 1306 to a temperature of about 400° C. In addition, the coolant may be evacuated from the heater body 1306 via the exhaust device 18. As a result, the temperature of the heater body 1306 may be easily and quickly increased or reduced.

With the temperature of the second surface 1400 of the heater body 1306 reduced, at least one die, substrate, or component is positioned proximate to the lumen 1316 located on the second surface 1400 of the heater body 1306. The external vacuum source (not shown) may then be activated, thereby resulting in the die, substrate, and/or component being coupled to the second surface 1400 of the heater body 1306 using vacuum force. As such, the die, substrate, and/or component will be heated to a desired temperature. One or more parts to be coupled to the die, substrate, and/or component may then be positioned thereon. Thereafter, the flow of coolant through the passages 1322 may be reduced or stopped, which results in the temperature of the second surface 1400 of the heater body 1306 to controllably rise, thereby melting an adhesive or epoxy located on the die, substrate, and/or component and coupling the part thereto.

In one embodiment, the temperature of the second surface 1400 quickly and controllably rises to an elevated temperature. In an alternate embodiment, the temperature of the second surface 1400 may be configured to slowly and controllably rise to an elevated temperature.

Once the part is coupled to the die, substrate, and/or component, the flow of coolant through the cooling passages 1322 of the heater body 1306 may begin or be increased. The coolant injected through the injectors 1304 results in the temperature of the second surface 1400 of the heater body 1306 to controllably decrease, thereby resulting in the adhesive and/or epoxy of the die, substrate, and/or component to harden, thereby coupling the part to the die, substrate, and/or component. In one embodiment, the flow of coolant through the injectors 14 results in the temperature of the second surface 1400 to quickly and controllably decrease. In an alternate embodiment, the flow of coolant through the injectors 1304 results in the temperature of the second surface 1400 to slowly and controllably decrease.

Thereafter, the completed component assembly may be removed from the rapid transition thermal management system 1300. Optionally, those skilled in the art will appreciate that the temperature of the second surface 1400 of the heater body 1306 may be easily and repeatedly cycled from an elevated temperature to a lower temperature or, in the alterative, held at a desired temperature.

Bond Chamber Sealing

FIGS. 16-20 show embodiments of a bond chamber seal system. More specifically, FIGS. 16-17 disclose a labyrinth seal system, formed during bonding by seal extensions 318 of the seal body 2002, which are aligned substantially orthogonally to the system X and Y axis and axially aligned with the system Z axis and are made to interlockingly engage seal extensions 318 on the seal collar 202, which are also aligned substantially orthogonally to the system X and Y axis and axially aligned with the system Z axis but facing the seal extensions of the seal body 2002, thereby forming the labyrinth seal passage 1700.

Figure 18:
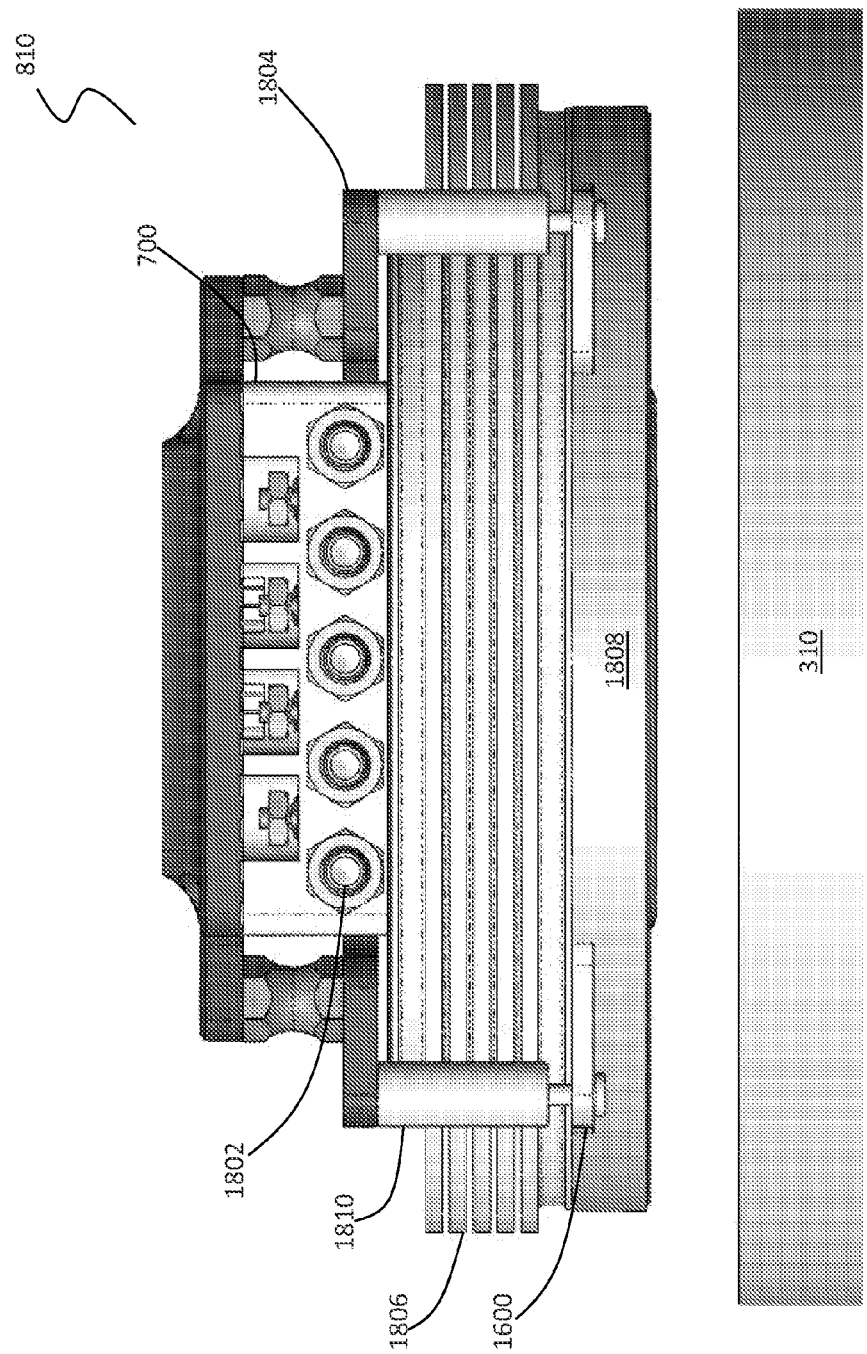
FIG. 18 is a front view of a slidable seal system in an unsealed state in accordance with another embodiment of the present invention.
Figure 19:
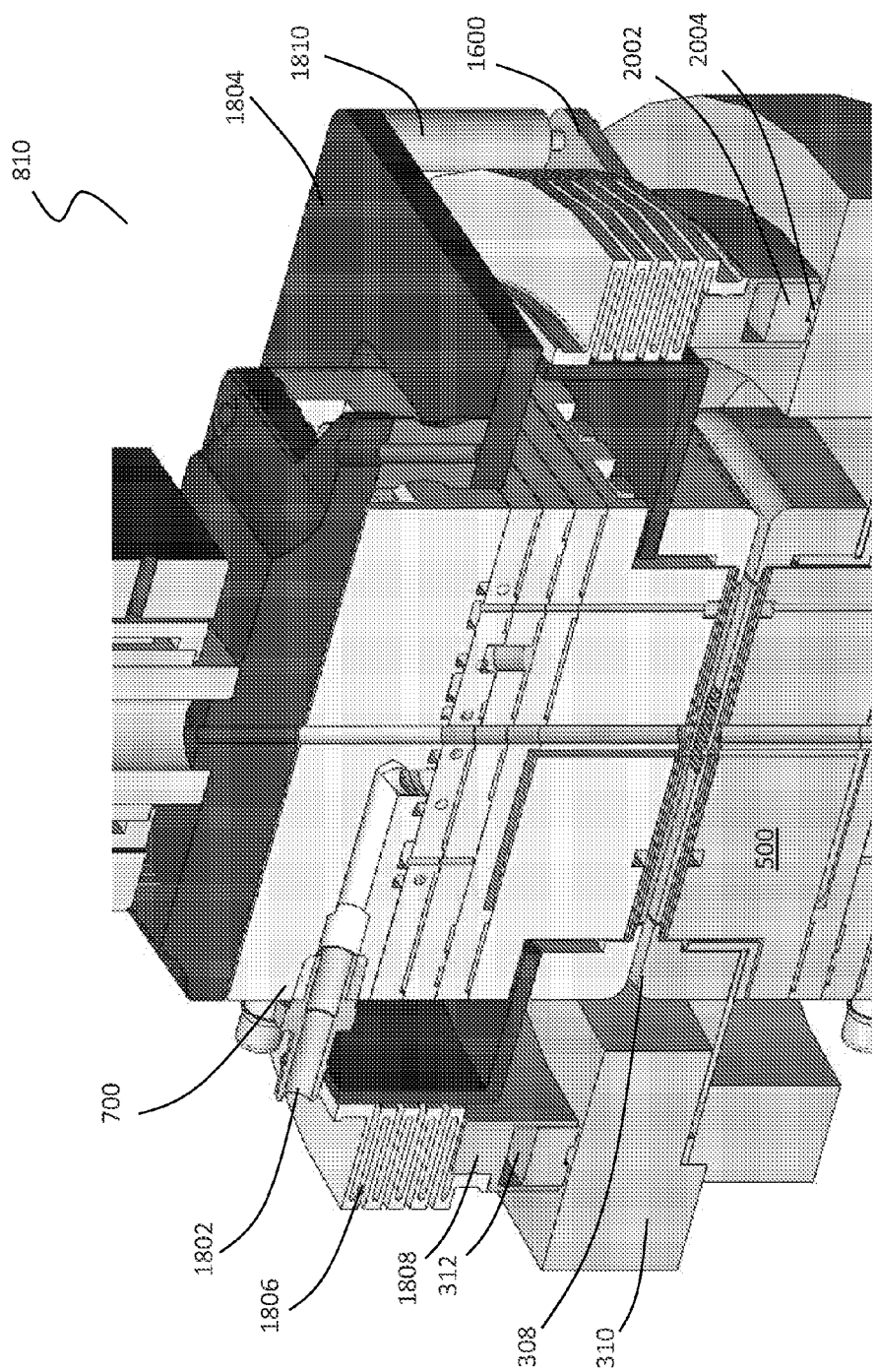
FIG. 19 is a top, left side perspective section view of a slidable seal system sealingly engaged to a sealing collar in accordance with one embodiment of the present invention.
Figure 20:
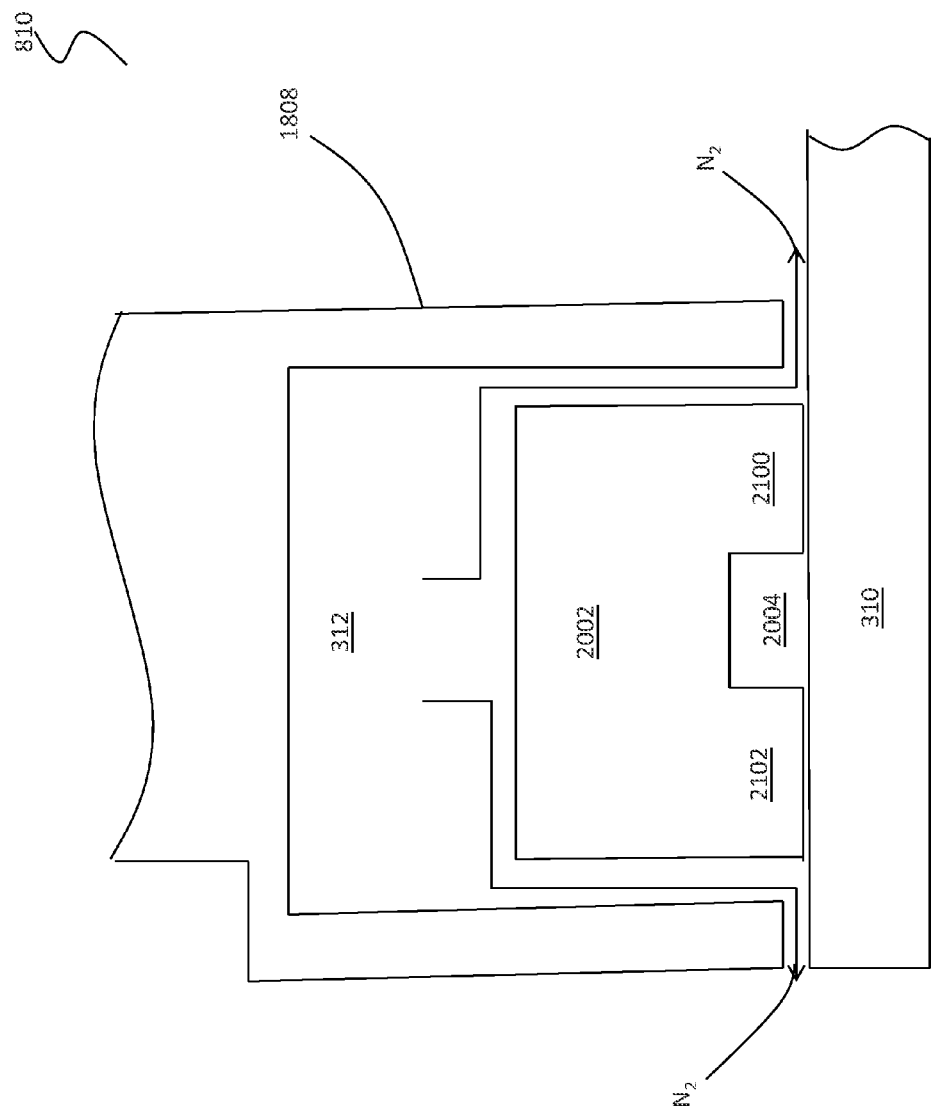
FIG. 20 is a front section view of a slidable seal system sealingly engaged to a sealing collar in accordance with one embodiment of the present invention.

FIGS. 18-20 show a slidable seal system 810 configured to create a closed environment containing at least a portion of the substrate head thermal control system body 500, die head thermal control system body 700 and bonding fixture 306. The slidable seal system 810 may include at least one substrate head thermal control system body 500 having one or more passages 1802 formed therein and at least one die head thermal control system body 700. In one embodiment, the bearing system comprises at least one air bearing. Optionally, those skilled in the art will appreciate that any number and variety of bearing systems may be used with the present system.

Referring again to FIGS. 18-20, the bearing body 1808 may include one or more extensions 1802 configured to have one or more actuators 1810 coupled thereto. During use, the actuators 1810 may be activated to controllably move at least one component forming the slidable seal system 810 along the Z axis. As such, at least one actuator 376 may be in communication with at least one controller or processor (not shown). In one embodiment, the actuators 1810 comprise linear motors. In another embodiment, the actuators 1810 may comprise piezo-actuators. Optionally, any variety of actuators 1810 may be used with the present system. Further, at least one of the bearing body 1808 and/or extension 1802 may be manufactured from any variety of materials, including, without limitations, porous carbon, aluminum, stainless steel, steel, various alloys, composite materials, plastics, and the like.

In some embodiments, the at least one passage 1802 may be in fluid communication with at least one source of a fluid (not shown). Exemplary fluids include, without limitations, nitrogen, oxygen, helium, hydrogen, various purge gases, inert gases and materials, vacuum sources, pressure sources, sensors, pressure gauges, cameras, thermocouples, epoxy sources, solder sources, and the like. Further, at least one passage 1802 may be in communication with the bonding chamber 308, thereby permitting the delivery and removal of at least one fluid from the bonding chamber 308.

Referring again to FIGS. 16-18, at least one plate member 1804 is coupled to or positioned proximate to the die head thermal control system body 700. In one embodiment, the plate member 1804 is constructed from aluminum. Those skilled in the art will appreciate that the plate member 1804 may be manufactured from any variety of materials. One or more compliant bodies or bellows 1806 may be positioned proximate to the die head thermal control system body 700. The compliant body 1806 is coupled in sealed relation to at least one bearing body 1808. The bearing body 1808 is configured to selectively engage or be positioned proximate to the seal collar 310 of the substrate thermal control system 2000 in sealed relation, thereby positioning the bonding chamber 308 within a sealed environment. As such, the compliant body 1806 and bearing body 1808 cooperatively form a slidable seal system 810 configured to be controllably moved along the Z axis.

As shown in FIG. 18, the bearing body 1808 include at least one fluid passage 312 formed therein. In one embodiment, the fluid passage 312 is in communication with at least one source of fluid. For example, in one embodiment, the fluid passage 312 is in communication with a nitrogen source (not shown). In another embodiment, the fluid passage 312 is in communication with an alternate source of inert fluid materials. Optionally, the fluid passage 312 may be in communication with any fluid source Still referring to FIGS. 16-18, at least one seal body 2002 may be positioned within the fluid passage 312 formed within the bearing body 1808. In one embodiment, the seal body 2002 is manufactured from at least one porous material or alloy. For example, in one embodiment, the seal body 2002 is manufactured from porous carbon. In another embodiment, the seal body 2002 is manufactured from one or more non-porous material.

As shown, the seal body 2002 includes at least one vacuum relief or passage 2004 formed thereon. In the illustrated embodiment, a single vacuum relief 2004 is formed on the seal body 2002, although those skilled in the art will appreciate that any number of vacuum reliefs 2004 may be formed thereon. As shown, the vacuum relief 2004 is located on the seal body 2002 proximate to the seal collar 310. Further, the vacuum relief 2004 may include one or more vacuum ports (not shown) formed therein. The vacuum port 2200 may be in fluid communication with at least one source of vacuum (not shown).

Referring again to FIGS. 16-18, a first seal surface 2100 and at least a second seal surface 2102 is formed on the seal body 2002 by the vacuum relief 2004. Those skilled in the art will appreciate that any number of seal surfaces may be formed on the seal body 2002.

Figure 17:
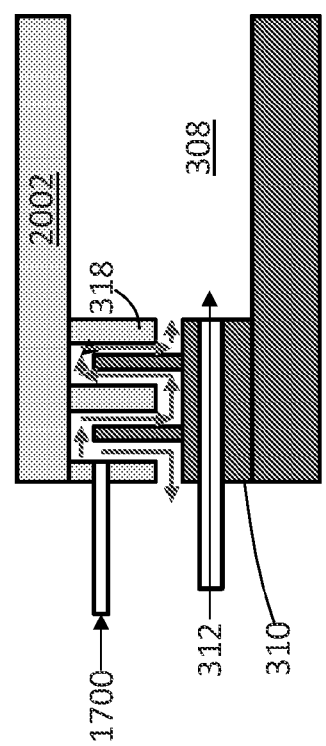
FIG. 17 is a section view of one portion of the labyrinth bonding chamber seal formed by the interlocking seal extensions shown in FIG. 16, in accordance with one embodiment of the present invention.

With reference still to FIGS. 16-18, during use a die is securely retained by the die head thermal control system body 700. Similarly, a substrate is positioned on and retained by the substrate head thermal control system body 500. Thereafter, the die head thermal control system body 700 is positioned proximate to the substrate head thermal control system body 500 as described above. Once positioned, the actuators 1810 are activated, thereby resulting in the bearing body 1808 extending to the seal collar 310. The compliant body 1806 permits the bearing body 1808 to extend to a position proximate to the seal collar 310 while remaining coupled to the die head thermal control system body 700.

Referring again to FIGS. 16-18, the seal body 2002 contained within the bearing body 1808 is positioned proximate to the seal collar 310 of the substrate thermal control system 2000. Thereafter, activation of the actuators 1810 is terminated. A vacuum force is applied to the vacuum relief 2004. In addition, one or more fluids may be flowed in to the fluid passage 312 formed in the bearing body 1808. For example, nitrogen may be flowed into the fluid passage 312. As shown in FIG. 18, a purge fluid (e.g. Nitrogen or other inert gases) may be flowed through the fluid passage 312 an evacuated into the bonding chamber 308 proximate to the first seal surface 2100. In addition, purge fluid may be flowed through the fluid passage 312 an evacuated from the seal system 362 proximate to the second seal surface 2102. As such, unlike prior art seal configurations, the slidable seal system 810 present herein permits the seal body 2002 to couple to the seal collar 310 using a vacuum force applied via the vacuum relief 2004 formed thereon, while flowing a purge fluid through the fluid passage 312 formed in the bearing body 1808.

Once the die is bonded to the substrate, the vacuum coupling force applied by seal body 2002 via the vacuum relief 2004 is terminated. Further, the flow of purge gas through the fluid passage 312 is stopped. Finally, the bearing body 1808 is retracted from the seal collar 310 by the actuators 1810, thereby permitting the die/substrate unit to be removed from the thermo-compression bonding system.

Calibration and General Procedures

With reference to FIGS. 1-20, described above, the following will provide a detailed description of a calibration process and thermo-compression bonding process using the aforementioned thermo-compression bonding system 100, described herein.

In one embodiment, the calibration process is user-initiated. In another embodiment, the calibration process may be initiated at pre-determined intervals based on time of use, number of wafers or substrates processed inspection results, and the like. In short, the calibration process may be run at any time desired. In one embodiment, to calibrate the system, the user actuates the controller 104 and selects the calibration option on the user interface (if present). Thereafter, the gantry 200 cycles through an initial alignment process and positions die bond head system 202 at a position approximately aligned with the substrate bond station 206. In one embodiment, the rough alignment position may be based on historical locations stored in the controller 104. In the alternative, one or more camera systems (e.g. camera assembly 608), laser alignment systems, optical systems, computer numerical control processing systems and the like may be used to obtain a rough alignment of the die bond head system 202 to the substrate bond station 206. During this alignment process, the first gantry positioner (not shown), second gantry positioner (not shown), theta positioning system 704, and z slide assembly 604 (i.e. four (4) degrees of freedom) may be configured to position the die head thermal control system body 700, located on the die bond head system 202, at a desired location proximate to the substrate bond station 206.

Thereafter, with the die bond head system 202 positioned proximate to the substrate bond station 206, the co-planarity of the substrate bond station 206 may be adjusted (to ensure co-planarity between the die head thermal control system body 700 and the substrate head thermal control system body 200) using the co-planarity system body 300. During the co-planarity adjustment process, the position of the die head thermal control system body 700 provides a reference for the co-planarity system body 300. As such, the seal collar 202 on the substrate thermal control system 200 is positioned proximate to the seal system 810 located on the die head thermal control system body 700. In one embodiment, seal body 2002 engages the seal collar 202. Optionally, a vacuum may be introduced into the bonding chamber 308, thereby increasing the coupling forces between the die bond head system 202 and substrate bond station 206 to aid in the co-planarity adjustment process.

With the seal collar 202 on the substrate thermal control system 200 positioned proximate to the seal system 810, located on the die head thermal control system body 700, the force generator 416 may be actuated, thereby resulting in the forcer 414 at least partially traversing the alignment orifice 418 and engaging the alignment body 404. As a result, the alignment body 404, which is loosely positioned within the alignment orifice 418, is advanced from the alignment orifice 418, thereby unlocking the co-planarity system body 300.

The force applicator 204, located on the die bond head system 202, may then be actuated, thereby resulting in a biasing force being applied to the force rod 800, located within the die bond head system 202. In one embodiment, the biasing force being applied to the force rod 800 by the force applicator 204 comprises a force extending therefrom the force applicator 204. In the alternative, the biasing force being applied by the force rod 800 by the force applicator 204 comprises a force retracting thereto the force applicator 204. As such, the biasing force applied by the force applicator 204 may be constant or variable. The biasing force applied by the force rod 800 is applied via the die head thermal control system body 700, located within the die bond head system 202, thereby providing a stable reference for the co-planarity adjustment process. In the alternative, the force applicator 204 and dashpot 906 may be configured to withdraw the force rod 52 into the die bond head system 202, thereby resulting in the die head thermal control system body 700 contacting the bearing system 320. As a result, the die bond head system 202 and die head thermal control system body 700 become a substantially rigid body. In summary, in one embodiment, the thermo-compression bonding system 100 may be configured to apply at least one biasing force via at least one of the force applicator 204, the dashpots 78, and the weight of the die head thermal control system body 700.

Once co-planarity is achieved, the position of the substrate bond station 206 is fixed by controllably retracting the force generator 416 in the co-planarity system body thereby resulting in the alignment body 404 re-engaging the alignment body support 408. A biasing lock force is applied to the alignment body support 408 via the alignment body 404 by the biasing member 402. Those skilled in the art will appreciate that any variety of alternate devices and systems may be used to fix the position of the substrate bond station 206. For example, mechanical systems, magnetic systems, vacuum systems, pneumatic systems, and/or any combination thereof may be used to fix the position of the substrate bond station 206 to ensure co-planarity.

Once the co-planarity system body 300 has been locked, the force rod 800, positioned within the die bond head system 202, may be disengaged and the die bond head system 202 may decouple from the fixed substrate bond station 206. Thereafter, thermo-compression bond processes may begin.

To process a substrate, the controller 104 moves the gantry 200, having the die bond head system 202 thereon, to a tray containing one or more substrates thereon. Those skilled in the art will appreciate that the substrate described herein may be defined as a semiconductor wafer, die, component, waveguide, semiconductor device, optical device, and the like. For example, in one embodiment, the thermo-compression bonding system 100 may be configured to precisely position one or more components on a semiconductor wafer. In an alternate embodiment, the thermo-compression bonding system 100 may be configured to precisely position one or more dies or similar semiconductor devices on die substrates, thereby forming a multiple stack semiconductor device. Optionally, a single bonding process may be conducted by placing multiple components on a substrate and conducting a single bonding process. In the alternative, multiple boding processes may be conducted on a single substrate by placing a single component on the substrate, conducting a bonding process, a repeating the component placement/bonding process numerous times.

The die head thermal control system body 700, located on the die bond head system 202, is positioned proximate to a substrate and is configured to controllably engage and retain the substrate therein. In one embodiment, a vacuum force is applied to the die head thermal control system body 700 via at least one fluid passage formed thereon. For example, at vacuum force may be controllably applied to the die head thermal control system body 700 via the fluid passage 312 and at least one port formed in or proximate to the recess chamber 308. Optionally, any variety of retaining forces or retaining devices may be positioned on the die head thermal control system body 700 to permit the controlled retention of at least one substrate and/or component by the die head thermal control system body.

Thereafter, the die bond head system 202 is positioned proximate to the substrate bond station 206 by at least one of the first gantry positioner (not shown), the second gantry positioner (not shown), the z slide assembly 604, and the theta positioning system 704. With the die bond head system 202 positioned, the force retaining the substrate within the thermal control body 210 is deactivated, thereby precisely positioning the substrate on the bonding fixture 306 located within the bonding chamber 308 of the substrate thermal control system 200. Optionally, a vacuum force may be applied to the substrate via the retaining port 314 which is in communication with the inlet 420 via the passage 236. In another embodiment, any variety of retaining devices may be positioned within the chamber 308 to securely position the substrate on the bonding fixture 306.

With substrate positioned, the die bond head system 202 may then be actuated to controllably engage and retain at least one component located within a tray. Like the substrate retention and positioning process, the die bond head system 202 is made to controllably engage and retain at least one component. Thereafter, the die bond head system 202, having at least one component retained thereby, is positioned proximate to the substrate bond station 206. In one embodiment, a camera assembly 608 having a first camera, looking upwards at the component retained by the die bond head system 202, and at least a second camera, looking downwards at the substrate, may be actuated to determine the positioned and orientation of the component relative to the substrate. If needed, the die bond head system 202 may be moved along the X axis, Y axis, Z axis, and about Theta (rotationally) to precisely adjust the position of the component relative to the positioning reference of the substrate. In one embodiment, the camera assembly 608 may be configured to use one or more features, edges, and/or physical characteristics of the component and/or substrate as positioning references. In another embodiment, the camera assembly 608 may use one or more fiducials or alignment marks on at least one of the component or substrate to aid in positioning.

Once the position of the component, relative to the substrate, has been determined, the camera assembly 608 is withdrawn and the z slide system 604 is actuated to position the seal body 2002, located on the seal system 810, to engage the seal collar 202 on the substrate head body 316. The use of a bellows and air bearing seal arrangement has been discussed previously in this disclosure. Here, the process will be discussed using the labyrinth bonding chamber 308 sealing arrangement in accordance with another embodiment of the present invention. More specifically, the seal extensions 318 of the seal body 2002, which are aligned substantially orthogonally to the system X and Y axis and axially aligned with the system Z axis, are made to interlockingly engage the seal extensions 318 on the seal collar 202, which are also aligned substantially orthogonally to the system X and Y axis and axially aligned with the system Z axis but facing the seal extensions of the seal body 2002, thereby forming the labyrinth seal passage 1700. Thereafter, a vacuum may be introduced into the bonding chamber 308 formed by the die head thermal control system body 700, on the die bond head system 202, and the substrate head thermal control system body 500, on the substrate bond station 206.

Thereafter, one or more fluids may be introduce into at least one of the labyrinth passage 1700 (see FIGS. 16-17) and/or the bonding chamber 308 formed by offset, interlocking seal extensions 318 located on the die head thermal control system body 700, on the die bond head system 202, and the substrate head thermal control system body 500, located on the substrate bond station 206. For example, one or more inert fluids may be introduced into the labyrinth passage 1700 (see FIGS. 16-17) thereby creating a pressurized fluid barrier within the labyrinth passage 1700 (see FIGS. 16-17). Exemplary inert fluid include, without limitations, nitrogen and the like.

With the pressurized fluid barrier present within the fluid passage 312 or labyrinth seal passage 1700 (see FIGS. 16-17), dependent on which seal arrangement is used, one or more oxide-reducing or oxide-purging fluids may be introduced into the bonding chamber 308. In one embodiment, nitrogen and formic acid are flowed through the bonding chamber 308, although those skilled in the art will appreciate that any variety of fluids may be introduced into the bonding chamber 308 through at least one of the fluid passages 312. As such, in one embodiment, the thermo-compression bonding system includes one or more sensors configured to determine the chemical composition of one or more fluid flowing into or from the bonding chamber 308. For example, one or more sensors may be configured to monitor the fluids exhausted from the bonding chamber 308 to detect the presence and levels of oxides, formic acid, out-gassed materials, and/or contaminants. During use the seal system 810 and the pressurized fluid barrier present within the fluid passage 312 or labyrinth seal passage 1700 (See FIGS. 16-17), dependent upon which seal embodiment is in use, restricts or prevents the purge fluids from entering or exiting the bonding chamber 308 through routes other than the fluid passages 312.

With the bonding chamber 308 purged of unwanted materials, the substrate and components located within the bonding chamber 308 may be heated to bond the component to the substrate. In one embodiment, the heating process comprises a rapid ramp rate heating and cooling cycle. The rapid ramp heating and cooling cycle is configured to rapidly heat a bonding agent (e.g. solder, adhesive, etc.) on the substrate or component to permit reflow of the die bumps or bonding pads positioned thereon. In one embodiment, the component retained by the die head thermal control system body 700 is positioned on or proximal to the substrate. Thereafter, heat may be rapidly applied to the bonding fixture 306 via at least one conduit 234 located therein. Optionally, the substrate head thermal control system body 500 may be similarly heated.

Once reflow of the bonding agent is achieved the temperature of the bonding fixture 306 is rapidly cooled to a temperature less than the melting point of the bonding agent, thereby coupling the component to the substrate. With the component bonded to the substrate the flow of purging fluid via the passage 312 may be terminated and any remaining fluids may be evacuated from the bonding chamber 308. Similarly, the fluid passage 312 or labyrinth passage 1700 (see FIGS. 16-17), dependent upon which embodiment of the seal is in use, may be purged. Thereafter, the z slide assembly 604 may be actuated which results in the seal body 180 disengaging the seal collar 202. Finally, the processed substrate having one or more components precisely bonded thereto may be removed from the thermo-compression bonding system 100.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A co-planarity adjustment system for thermo-compression bonding systems, more specifically for bringing a die bond head system and a substrate bond station into a parallel relationship, comprising:
    a planar master surface;
    an opposing planar slave surface, mounted on a spherical bearing assembly whereby the orientation of the planar slave surface with respect to the planar master surface is variable within the limits of the spherical bearing assembly;
    a spherical bearing lock mechanism comprising a spherical bearing supported in a spherical bearing seat and an axially oriented locking member comprising a retaining head and a shaft, said shaft extending through an oversize aperture in the spherical bearing and slidably extending through an aperture in the spherical bearing seat, a distal end normally held in tension with respect to the spherical bearing assembly to bring the spherical bearing into locking contact with the spherical bearing seat whereby the spherical bearing assembly is immobilized, wherein said spherical bearing lock mechanism is configured to normally hold said spherical bearing assembly in a locked position whereby the orientation of the planar slave surface is locked;
    a spherical bearing release mechanism comprising a fluid system configured upon actuation to apply a first fluid under pressure to the distal end of said locking member so as to overcome said tension and move said locking member so as to disengage said locking contact between the spherical bearing and the spherical bearing seat, and to inject a bearing fluid under pressure between said spherical bearing seat and said spherical bearing whereby said spherical bearing assembly is functional, and upon deactivation to reduce pressure of said first fluid and said bearing fluid and thereby allow the lock mechanism to relock said spherical bearing assembly; and
    a drive mechanism operating along an axis substantially orthogonal to the planar master surface, configured to bring the planar master surface and the planar slave surface into surface contact.

2. The co-planarity adjustment system of claim 1, wherein the center of the planar slave surface is located orthogonally from a center of the spherical bearing whereby motion of the planar slave surface when the spherical bearing assembly is functional is substantially constrained to changes in orientation with respect to the orthogonal axis.

3. The co-planarity adjustment system of claim 1, wherein the orientation of the planar slave surface with respect to the planar master surface is variable at least +/−2 degrees.

4. The co-planarity adjustment system of claim 1 wherein the spherical bearing assembly is weighted or otherwise biased to axially align to a system z-axis, which is oriented substantially vertically, when unlocked or otherwise in a compliant state.

* * * * *